(12) United States Patent
Strasser et al.

(10) Patent No.: US 8,189,407 B2
(45) Date of Patent: May 29, 2012

(54) APPARATUS, SYSTEM, AND METHOD FOR BIASING DATA IN A SOLID-STATE STORAGE DEVICE

(75) Inventors: John Strasser, Syracuse, UT (US); Jonathan Thatcher, Liberty Lake, WA (US); Jeremy Fillingim, Salt Lake City, UT (US); David Flynn, Sandy, UT (US); Lance Smith, San Jose, CA (US); Robert Wood, Nwot, CO (US); James Peterson, San Jose, CA (US)

(73) Assignee: Fusion-io, Inc., Salt Lake City, UT (US)

( * ) Notice: Subject to any disclaimer, the term of this patent is extended or adjusted under 35 U.S.C. 154(b) by 0 days.

(21) Appl. No.: 12/981,394

(22) Filed: Dec. 29, 2010

(65) Prior Publication Data

US 2011/0157992 A1    Jun. 30, 2011

Related U.S. Application Data

(63) Continuation of application No. 11/952,091, filed on Dec. 6, 2007.

(60) Provisional application No. 61/290,816, filed on Dec. 29, 2009, provisional application No. 61/305,496, filed on Feb. 17, 2010.

(51) Int. Cl.
*G11C 5/14* (2006.01)
(52) U.S. Cl. ............... 365/189.09; 365/189.11
(58) Field of Classification Search ............. 365/189.09, 365/189.11, 189.011; 711/161, 103, 162
See application file for complete search history.

(56) References Cited

U.S. PATENT DOCUMENTS

| | | | |
|---|---|---|---|
| 5,261,068 A | 11/1993 | Gaskins et al. | |
| 5,291,496 A | 3/1994 | Andaleon et al. | |
| 5,313,475 A | 5/1994 | Cromer et al. | |
| 5,325,509 A | 6/1994 | Lautzenheiser | |
| 5,404,485 A | 4/1995 | Ban | |
| 5,438,671 A | 8/1995 | Miles | |

(Continued)

FOREIGN PATENT DOCUMENTS

GB    0123416.0    9/2001

OTHER PUBLICATIONS

"White Paper: S2A9550 Overview", DataDirect Networks, www.datadirectnet.com, Jun. 10, 2007, 17 pages.

(Continued)

*Primary Examiner* — Gene Auduong
(74) *Attorney, Agent, or Firm* — Kunzler Needham Massey & Thorpe

(57) ABSTRACT

An apparatus, system, and method are disclosed for improving performance in a non-volatile solid-state storage device. Non-volatile solid-state storage media includes a plurality of storage cells. The plurality of storage cells is configured such that storage cells in an empty state store initial binary values that satisfy a bias. An input module receives source data for storage in the plurality of storage cells of the non-volatile solid-state storage media. Bits of the source data have a source bias that is different from the bias of the plurality of storage cells. A bit biasing module biases the bits of the source data toward the bias of the plurality of storage cells. A write module writes the biased source data to the plurality of storage cells of the non-volatile solid-state storage media.

23 Claims, 8 Drawing Sheets

U.S. PATENT DOCUMENTS

| | | |
|---|---|---|
| 5,504,882 A | 4/1996 | Chai |
| 5,559,988 A | 9/1996 | Durante et al. |
| 5,594,883 A | 1/1997 | Pricer |
| 5,603,001 A | 2/1997 | Sukegawa et al. |
| 5,701,434 A | 12/1997 | Nakagawa |
| 5,754,563 A | 5/1998 | White |
| 5,845,313 A | 12/1998 | Estakhri et al. |
| 5,845,329 A | 12/1998 | Onishi et al. |
| 5,907,856 A | 5/1999 | Estakhri et al. |
| 5,924,113 A | 7/1999 | Estakhri et al. |
| 5,930,815 A | 7/1999 | Estakhri et al. |
| 5,960,462 A | 9/1999 | Solomon et al. |
| 5,961,660 A | 10/1999 | Capps, Jr. et al. |
| 5,969,986 A | 10/1999 | Wong et al. |
| 6,000,019 A | 12/1999 | Dykstal et al. |
| 6,105,076 A | 8/2000 | Beardsley et al. |
| 6,128,695 A | 10/2000 | Estakhri et al. |
| 6,141,249 A | 10/2000 | Estakhri et al. |
| 6,145,051 A | 11/2000 | Estakhri et al. |
| 6,170,039 B1 | 1/2001 | Kishida |
| 6,170,047 B1 | 1/2001 | Dye |
| 6,172,906 B1 | 1/2001 | Estakhri et al. |
| 6,173,381 B1 | 1/2001 | Dye |
| 6,185,654 B1 | 2/2001 | Van Doren |
| 6,223,308 B1 | 4/2001 | Estakhri et al. |
| 6,230,234 B1 | 5/2001 | Estakhri et al. |
| 6,240,040 B1 | 5/2001 | Akaogi et al. |
| 6,330,688 B1 | 12/2001 | Brown |
| 6,356,986 B1 | 3/2002 | Solomon et al. |
| 6,370,631 B1 | 4/2002 | Dye |
| 6,385,710 B1 | 5/2002 | Goldman et al. |
| 6,393,513 B2 | 5/2002 | Estakhri et al. |
| 6,404,647 B1 | 6/2002 | Minne |
| 6,412,080 B1 | 6/2002 | Fleming et al. |
| 6,418,478 B1 | 7/2002 | Ignatius et al. |
| 6,523,102 B1 | 2/2003 | Dye et al. |
| 6,587,915 B1 | 7/2003 | Kim |
| 6,601,211 B1 | 7/2003 | Norman |
| 6,625,685 B1 | 9/2003 | Cho et al. |
| 6,671,757 B1 | 12/2003 | Multer et al. |
| 6,675,349 B1 | 1/2004 | Chen |
| 6,715,046 B1 | 3/2004 | Shoham et al. |
| 6,728,851 B1 | 4/2004 | Estakhri et al. |
| 6,751,155 B2 | 6/2004 | Gorobets |
| 6,754,774 B2 | 6/2004 | Gruner et al. |
| 6,757,800 B1 | 6/2004 | Estakhri et al. |
| 6,775,185 B2 | 8/2004 | Fujisawa et al. |
| 6,779,088 B1 | 8/2004 | Benveniste et al. |
| 6,785,785 B2 | 8/2004 | Piccirillo et al. |
| 6,801,979 B1 | 10/2004 | Estakhri |
| 6,877,076 B1 | 4/2005 | Cho et al. |
| 6,880,049 B2 | 4/2005 | Gruner et al. |
| 6,883,079 B1 | 4/2005 | Priborsky |
| 6,910,170 B2 | 6/2005 | Choi et al. |
| 6,912,618 B2 | 6/2005 | Estakhri et al. |
| 6,938,133 B2 | 8/2005 | Johnson et al. |
| 6,977,599 B2 | 12/2005 | Widmer |
| 6,978,342 B1 | 12/2005 | Estakhri et al. |
| 6,996,676 B2 | 2/2006 | Megiddo |
| 7,000,063 B2 | 2/2006 | Friedman et al. |
| 7,010,652 B2 | 3/2006 | Piccirillo et al. |
| 7,010,662 B2 | 3/2006 | Aasheim et al. |
| 7,043,599 B1 | 5/2006 | Ware et al. |
| 7,050,337 B2 | 5/2006 | Iwase et al. |
| 7,058,769 B1 | 6/2006 | Danilak |
| 7,076,723 B2 | 7/2006 | Saliba |
| 7,082,512 B2 | 7/2006 | Aasheim et al. |
| 7,085,879 B2 | 8/2006 | Aasheim et al. |
| 7,089,391 B2 | 8/2006 | Geiger et al. |
| 7,093,101 B2 | 8/2006 | Aasheim et al. |
| 7,096,321 B2 | 8/2006 | Dharmendra |
| 7,111,140 B2 | 9/2006 | Estakhri et al. |
| 7,149,947 B1 | 12/2006 | MacLellan et al. |
| 7,167,953 B2 | 1/2007 | Megiddo |
| 7,178,081 B2 | 2/2007 | Lee et al. |
| 7,181,572 B2 | 2/2007 | Walmsley |
| 7,194,577 B2 | 3/2007 | Johnson et al. |
| 7,215,580 B2 | 5/2007 | Gorobets |
| 7,219,238 B2 | 5/2007 | Saito et al. |
| 7,243,203 B2 | 7/2007 | Scheuerlein |
| 7,246,179 B2 | 7/2007 | Camara |
| 7,305,520 B2 | 12/2007 | Voigt |
| 7,340,566 B2 | 3/2008 | Voth |
| 7,424,593 B2 | 9/2008 | Estakhri et al. |
| 7,441,090 B2 | 10/2008 | Estakhri et al. |
| 7,450,420 B2 | 11/2008 | Sinclair |
| 7,487,320 B2 | 2/2009 | Bansal |
| 7,523,249 B1 | 4/2009 | Estakhri et al. |
| 7,549,013 B2 | 6/2009 | Estakhri et al. |
| 7,552,271 B2 | 6/2009 | Sinclair |
| 7,644,239 B2 | 1/2010 | Ergan et al. |
| 7,725,628 B1 | 5/2010 | Phan |
| 7,873,803 B2 * | 1/2011 | Cheng ........................ 711/161 |
| 2002/0069317 A1 | 6/2002 | Chow et al. |
| 2002/0069318 A1 | 6/2002 | Chow et al. |
| 2002/0194451 A1 | 12/2002 | Mukaida et al. |
| 2003/0061296 A1 | 3/2003 | Craddock |
| 2003/0093741 A1 | 5/2003 | Argon et al. |
| 2003/0198084 A1 | 10/2003 | Fujisawa et al. |
| 2004/0064647 A1 | 4/2004 | DeWhitt |
| 2004/0186946 A1 | 9/2004 | Lee |
| 2004/0268359 A1 | 12/2004 | Hanes |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0055497 A1 | 3/2005 | Estakhri et al. |
| 2005/0132148 A1 | 6/2005 | Arimilli et al. |
| 2005/0132259 A1 | 6/2005 | Emmot et al. |
| 2005/0144361 A1 | 6/2005 | Gonzalez et al. |
| 2005/0149618 A1 | 7/2005 | Cheng |
| 2005/0149819 A1 | 7/2005 | Hwang |
| 2005/0193166 A1 | 9/2005 | Johnson et al. |
| 2005/0229090 A1 | 10/2005 | Shen et al. |
| 2005/0240713 A1 | 10/2005 | Wu |
| 2005/0246510 A1 | 11/2005 | Retnamma et al. |
| 2006/0004955 A1 | 1/2006 | Ware et al. |
| 2006/0075057 A1 | 4/2006 | Gildea |
| 2006/0152981 A1 | 7/2006 | Ryu |
| 2006/0248387 A1 | 11/2006 | Nicholson |
| 2007/0016699 A1 | 1/2007 | Minami |
| 2007/0050571 A1 | 3/2007 | Nakamura |
| 2007/0074092 A1 | 3/2007 | Dammann et al. |
| 2007/0086260 A1 | 4/2007 | Sinclair |
| 2007/0162830 A1 | 7/2007 | Stek et al. |
| 2007/0198770 A1 | 8/2007 | Horii et al. |
| 2007/0204197 A1 | 8/2007 | Yokokawa |
| 2007/0204199 A1 | 8/2007 | Chung et al. |
| 2007/0233937 A1 | 10/2007 | Coulson |
| 2007/0245217 A1 | 10/2007 | Valle |
| 2007/0271468 A1 | 11/2007 | McKenney et al. |
| 2007/0271572 A1 | 11/2007 | Gupta et al. |
| 2007/0274150 A1 | 11/2007 | Gorobets |
| 2007/0300008 A1 | 12/2007 | Rogers |
| 2008/0022187 A1 | 1/2008 | Bains |
| 2008/0141043 A1 * | 6/2008 | Flynn et al. ................. 713/193 |
| 2009/0043952 A1 | 2/2009 | Estakhri et al. |
| 2009/0083485 A1 | 3/2009 | Cheng |
| 2009/0204750 A1 | 8/2009 | Estakhri et al. |
| 2009/0235017 A1 | 9/2009 | Estakhri et al. |
| 2010/0091535 A1 | 4/2010 | Sommer et al. |
| 2011/0182119 A1 * | 7/2011 | Strasser et al. ........... 365/185.03 |

OTHER PUBLICATIONS

"Pivot3 RAIGE Storage Cluster: Technology Overview", Pivot 3, White Paper, www.pivot3.com, Jun. 2007, pp. 1-17.
ASPMC_660, Asine Group, http://www.asinegroup.com/products/asprric660.html, copyright 2002, downloaded on Nov. 18, 2009.
BiTMICRO Introduces E-Disk PMC Flash Disk Module at Military & Aerospace Electronics East, May 18, 2004, BiTMICRO, http://www.bitmicro.com/press_news_releases_20040518_prt.php.
NAND Flash 101: An Introduction to NAND Flash and How to Design It In to Your Next Product, Micron, pp. 1-28, Micron Technology Nov. 2006.
ECC Algorithm, The Leader in Memory Technology, Samsung Electronics, Mar. 2005, http://www.samsung.com/global/business/semiconductor/products/flash/FlashApplicationNote.html.

Ismail Ari et al., Performance Boosting and Workload Isolation in Storage Area Networks with SANCache, Proceedings of the 23rd IEEE/14th NASA Goddard Conference on Mass Storage Systems and Technologies, May 2006, pp. 263-273, College Park, MD.

File System Primer, CoolSolutionsWiki, Downloaded Oct. 18, 2006, http://wiki.novell.com/index.php/File_System_Primer.

Morgenstern, Is There a Flash Memory RAID in Your Future, Nov. 8, 2006, Ziff Davis Enterprise Holdings Inc., http://www.eweek.com.

High Speed Elevated Board Stacking, Samtec Inc., Apr. 2007.

Leventhal, Flash Storage Memory, Communications of the ACM, Jul. 2008, pp. 47-51, vol. 51, No. 7.

Method for fault tolerance in nonvolatile storage, IP.com PriorArt Database Technical Disclosure, Feb. 3, 2005, IP.com Electric Publication, www.ip.com.

Plank, A Tutorial on Reed-Solomon Coding for Fault-Tolerance in RAID-like Systems, University of Tennessee Department of Computer Science Technical Report CS-96-332, Jul. 1996.

Am29DL332D/323D/324D, Spansion, Oct. 7, 2004, www.amd.com.

Ralph O. Weber, SCSI Object-Based Storage Device Commands (ODS), ANSI, Jul. 30, 2004, pp. 0-74, Part 1 of 3.

Ralph O. Weber, SCSI Object-Based Storage Device Commands (ODS), ANSI, pp. 75-164, Part 2 of 3.

Ralph O. Weber, SCSI Object-Based Storage Device Commands (ODS), ANSI, pp. 165-171, Part 3 of 3.

PCT/US2007/086683, 2380.2.1pct, International Search Report and Written Opinion, Oct. 26, 2009.

PCT/US2007/086683, 2380.2.1pct, International Preliminary Report on Patentability, Nov. 5, 2009.

2380.2.1CN Office Action, CN Application No. 200780050974.9, Aug. 11, 2011.

Hensbergen, Dynamic Policy Disk Caching for Storage Networking, Nov. 11, 2006.

Singer, Implementing MLC NAND Flash for Cost-Effective, High-Capacity Memory, Sep. 1, 2003.

Mesnier, Object-Based Storage, Aug. 1, 2003.

PCT/US2009/039572, 2380.2.20pct, International Preliminary Report on Patentability, Oct. 14, 2010.

PCT/US2007/086686, 2380.2.2pct, International Search Report and Written Opinion, Apr. 28, 2008.

PCT/US2007/086686, 2380.2.2pct, International Preliminary Report on Patentability, Dec. 16, 2008.

Samsung Electronics, Introduction to Samsung's Linux Flash File System-RFS, Version 1.0, Nov. 2006.

PCT/US2009/039572, International Search Report and Written Opinion, Jul. 30, 2009.

* cited by examiner

APPARATUS, SYSTEM, AND METHOD FOR BIASING DATA IN A SOLID-STATE STORAGE DEVICE

CROSS-REFERENCE TO RELATED APPLICATIONS

This application claims priority to U.S. Provisional Patent Application No. 61/290,816 entitled "APPARATUS, SYSTEM, AND METHOD FOR BIASING DATA IN A SOLID-STATE STORAGE DEVICE" and filed on Dec. 29, 2009 for Lance Smith, et al. and to U.S. Provisional Patent Application No. 61/305,496 entitled "APPARATUS, SYSTEM, AND METHOD FOR BIASING DATA IN A SOLID-STATE STORAGE DEVICE" and filed on Feb. 17, 2010 for Lance Smith, et al., and is a continuation application of and claims priority to U.S. patent application Ser. No. 11/952,091 entitled "APPARATUS, SYSTEM, AND METHOD FOR MANAGING DATA USING A DATA PIPELINE" and filed on Dec. 6, 2007 for David Flynn, et al., each of which are incorporated herein by reference.

FIELD

The subject matter disclosed herein relates to solid-state storage devices and more particularly relates to improving performance in solid-state storage devices.

BACKGROUND

Description of the Related Art

Storage devices have various characteristics and store data in different ways. Solid-state storage devices typically store data in storage cells. Some solid-state storage cells have a finite usable lifetime and may become unreliable after a finite number of programs or writes.

Data written to storage devices often tends to have certain patterns. Headers or other metadata may typically have similar values and a similar position in the data, padding data may consistently be added to the end of a file, or other repeated data patterns may be written to media of a storage device. Writing the same data to storage cells of a solid-state storage device repeatedly can shorten the usable lifetime of the solid-state storage device prematurely, by programming or writing to certain storage cells disproportionally due to repeated patterns of data.

BRIEF SUMMARY

From the foregoing discussion, it should be apparent that a need exists for an apparatus, system, and method that improve performance in a non-volatile solid-state storage device. Beneficially, such an apparatus, system, and method would improve performance by biasing data toward a bias of the non-volatile solid-state storage device.

The present invention has been developed in response to the present state of the art, and in particular, in response to the problems and needs in the art that have not yet been fully solved by currently available storage devices. Accordingly, the present invention has been developed to provide an apparatus, system, and method for improving performance in a non-volatile solid-state storage device that overcome many or all of the above-discussed shortcomings in the art.

A method of the present invention is presented for improving performance in a non-volatile solid-state storage device. The method in the disclosed embodiments substantially includes the steps necessary to carry out the functions presented below with respect to the operation of the described apparatus and system. In one embodiment, the method includes providing non-volatile solid-state storage media that includes a plurality of storage cells. The plurality of storage cells, in one embodiment, is configured such that storage cells in an empty state store initial binary values that satisfy a bias. The method, in a further embodiment, includes receiving source data for storage in the plurality of storage cells of the non-volatile solid-state storage media. Bits of the source data, in certain embodiments, have a source bias that is different from the bias of the plurality of storage cells.

In a further embodiment, the method includes biasing the bits of the source data toward the bias of the plurality of storage cells. The method, in another embodiment, includes writing the biased source data to the plurality of storage cells of the non-volatile solid-state storage media. In one embodiment, the method includes reading the biased source data from the plurality of storage cells of the non-volatile solid-state storage media and converting the bits of the biased source data back to original bit values for the source data such that a bias of the bits returns to the source bias.

The method, in one embodiment, includes determining that the source bias of the source data is different from the bias of the plurality of storage cells. In another embodiment, the method includes storing an indicator for the biased source data to indicate that the bits of the biased source data have been biased. The method, in a further embodiment, includes shifting the bits within the source data according to a reversible algorithm so that a start position for data and metadata within the source data changes between writing the biased source data to the plurality of storage cells and writing subsequent biased source data to the plurality of storage cells.

In one embodiment, the bias of the plurality of storage cells is a bias toward ones. In another embodiment, the bias of the plurality of storage cells is a bias toward zeroes. In a further embodiment, the bias of the plurality of storage cells is a bias toward a balance of ones and zeroes. The bias of the plurality of storage cells, in certain embodiments, is a bias toward a binary pattern. In one embodiment, the binary pattern is selected based on a state of one or more other storage cells physically adjacent to the plurality of storage cells. The binary pattern, in another embodiment, satisfies a predefined voltage differential threshold between the one or more other storage cells and the plurality of storage cells.

Biasing the bits of the source data, in one embodiment, includes flipping binary values of the bits to satisfy the bias of the plurality of storage cells. In another embodiment, biasing the bits includes reversibly pseudo-randomizing the values of the bits of the source data. Biasing the bits, in a further embodiment, includes retrieving a preset sequence number associated with the plurality of storage cells. In another embodiment, biasing the bits includes entering the preset sequence number into a pseudo-random number generator as a seed value to obtain a pseudo-random binary sequence. In one embodiment, biasing the bits includes biasing the bits of the source data toward the bias of the plurality of storage cells by pseudo-randomizing the values of the bits of the source data using the pseudo-random binary sequence.

The preset sequence number, in one embodiment, is a sequence number of an erase block associated with the plurality of storage cells. The preset sequence number, in a further embodiment, is stored in a predefined location in the erase block during an erase procedure. In certain embodiments, the preset sequence number for the erase block changes with each erase procedure.

In one embodiment, biasing the bits includes padding the source data with padding data. The padding data, in a further embodiment, has binary values that bias the source data toward the bias of the plurality of storage cells. In another embodiment, biasing the bits includes compressing the source data. In certain embodiments, biasing the bits includes selecting a size of padding data based on an amount of space gained by the compression and padding the compressed source data with the padding data.

In another embodiment, biasing the bits of the source data includes biasing a plurality of bits of the source data so that storage cells of the source data storing the plurality of bits change state from original-state storage cells to active storage cells. The plurality of bits of the source data, in one embodiment, is a subset of the source data. In a further embodiment, biasing the bits of the source data includes dividing the source data into a plurality of subsets of the source data and biasing the subsets of the source data. The subsets of the source data, in one embodiment, are sized to fit a write data pipeline. In addition, in another embodiment, the subsets of the source data are sized to fit sections of data flowing through a stream of data flowing in a read data pipeline, as described below.

In one embodiment, the bits of the source data are biased toward the bias of the plurality of storage cells without matching the bias of the plurality of storage cells. Biasing bits of the source data toward the bias of the plurality of storage cells without matching the bias of the plurality of storage cells, in certain embodiments, ensures that the biased source data is distinguishable from the plurality of storage cells in the empty state.

An apparatus to improve performance in a non-volatile solid-state storage device is provided with a plurality of modules configured to functionally execute the necessary steps of biasing bits of source data. These modules in the described embodiments include non-volatile solid-state storage media, an input module, a bit biasing module, and a write module.

The non-volatile solid-state storage media, in one embodiment, includes a plurality of storage cells. The plurality of storage cells, in a further embodiment, is configured such that storage cells in an empty state store initial binary values that satisfy a bias. In one embodiment, the input module receives source data for storage in the plurality of storage cells of the non-volatile solid-state storage media. Bits of the source data, in certain embodiments, have a source bias that is different from the bias of the plurality of storage cells.

The bit biasing module, in one embodiment, biases the bits of the source data toward the bias of the plurality of storage cells. In one embodiment, the bit biasing module retrieves a preset sequence number associated with the plurality of storage cells. In another embodiment, the bit biasing module enters the preset sequence number into a pseudo-random number generator as a seed value to obtain a pseudo-random binary sequence. The bit biasing module, in a further embodiment, biases the bits of the source data toward the bias of the plurality of storage cells by pseudo-randomizing the values of the bits of the source data using the pseudo-random binary sequence. The write module, in one embodiment, writes the biased source data to the plurality of storage cells of the non-volatile solid-state storage media.

A system of the present invention is also presented to improve performance in a non-volatile solid-state storage device. The system may be embodied by a processor, one or more communications buses, non-volatile solid-state storage media, an input module, a bit biasing module, and a write module. The one or more communications buses, in one embodiment, are in communication with the processor. The input module, in a further embodiment, receives source data from the processor over the one or more communications buses for storage in the non-volatile solid-state storage media.

The non-volatile solid-state storage media, in one embodiment, includes a plurality of storage cells. The plurality of storage cells, in a further embodiment, is configured such that storage cells in an empty state store initial binary values that satisfy a bias. In one embodiment, the input module receives source data that has a source bias that is different from the bias of the plurality of storage cells. The bit biasing module, in one embodiment, biases the bits of the source data toward the bias of the plurality of storage cells. The write module, in a further embodiment, writes the biased source data to the plurality of storage cells of the non-volatile solid-state storage media.

Another method of the present invention is presented for improving performance in a non-volatile solid-state storage device. The method, in one embodiment, includes providing non-volatile solid-state storage media including a plurality of storage cells. In another embodiment, the method includes receiving source data for storage in the plurality of storage cells of the non-volatile solid-state storage media. The method, in a further embodiment, includes shifting bits within the source data according to a reversible algorithm. In one embodiment, the bits are shifted so that a start position for data and metadata within the source data changes between writing the source data to the plurality of storage cells and writing subsequent source data to the plurality of storage cells. In another embodiment, the method includes writing the shifted source data to the plurality of storage cells of the non-volatile solid-state storage media.

In one embodiment, the method includes biasing bits of the source data toward a bias of the plurality of storage cells. The plurality of storage cells, in certain embodiments, is configured such that storage cells in an empty state store initial binary values that satisfy a bias. In one embodiment, the bits of the source data as received have a source bias that is different from the bias of the plurality of storage cells.

References throughout this specification to features, advantages, or similar language do not imply that all of the features and advantages may be realized in any single embodiment. Rather, language referring to the features and advantages is understood to mean that a specific feature, advantage, or characteristic is included in at least one embodiment. Thus, discussion of the features and advantages, and similar language, throughout this specification may, but do not necessarily, refer to the same embodiment.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter.

BRIEF DESCRIPTION OF THE DRAWINGS

In order that the advantages of the invention will be readily understood, a more particular description of the invention will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
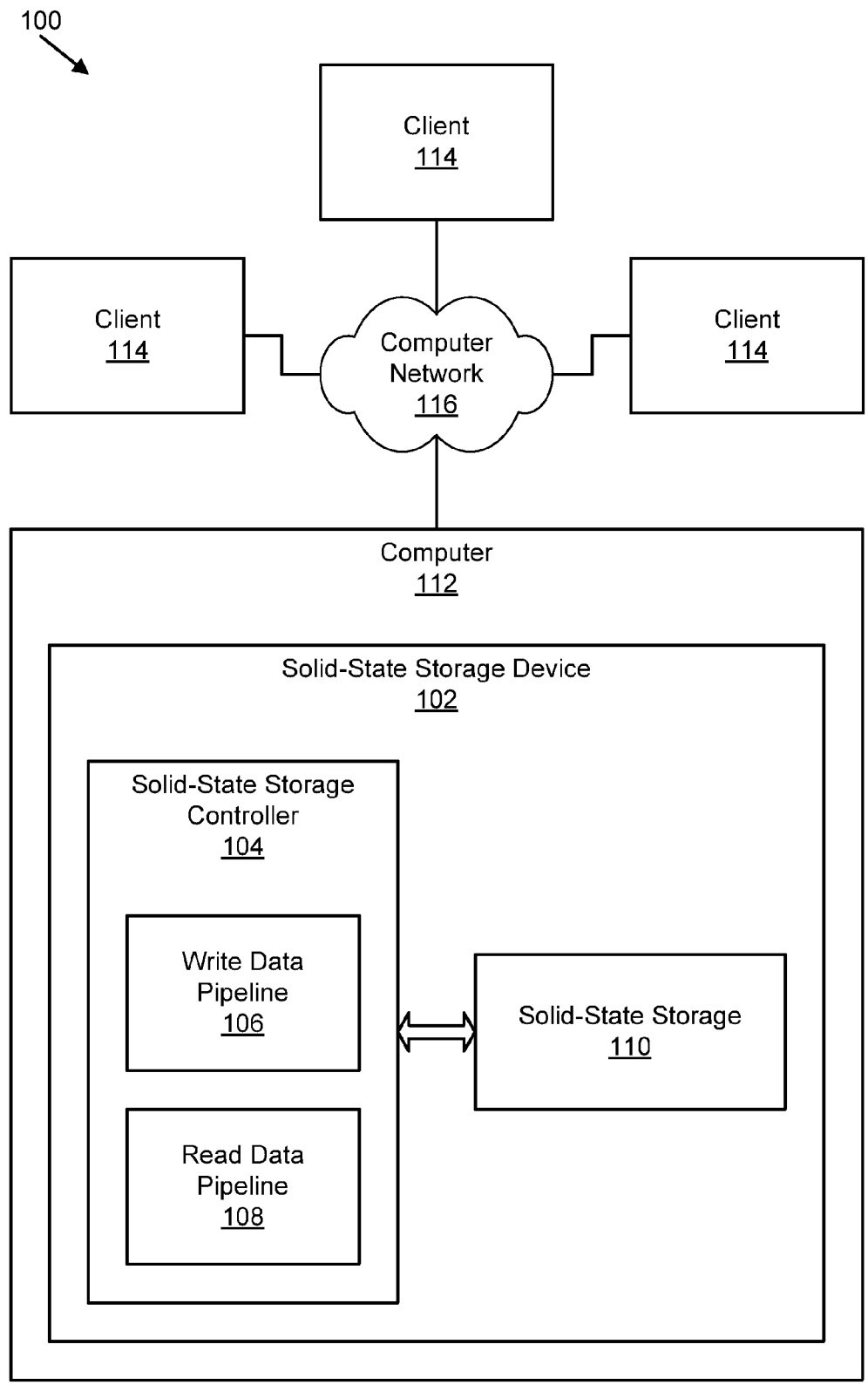
FIG. 1 is a schematic block diagram illustrating one embodiment of a system for improving performance in a solid-state storage device in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus memory device. A computer readable medium may be embodied by a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Solid-State Storage System

FIG. 1 is a schematic block diagram illustrating one embodiment of a system 100 for improving performance in a solid-state storage device in accordance with the present invention. The system 100 includes a solid-state storage device 102, a solid-state storage controller 104, a write data pipeline 106, a read data pipeline 108, a solid-state storage media 110, a computer 112, a client 114, and a computer network 116, which are described below.

The system 100 includes at least one solid-state storage device 102. In another embodiment, the system 100 includes two or more solid-state storage devices 102. Each solid-state storage device 102 may include non-volatile, solid-state storage media 110, such as flash memory, nano random access memory ("nano RAM or NRAM"), magneto-resistive RAM ("MRAM"), dynamic RAM ("DRAM"), phase change RAM ("PRAM"), racetrack memory, memristor memory, nanocrystal wire-based memory, silicon-oxide based sub-10 nanometer process memory, graphene memory, silicon-oxide-nitride-oxide-silicon ("SONOS") memory, resistive random-access memory ("RRAM"), programmable metallization cell ("PMC"), conductive-bridging RAM ("CBRAM"), or the like. The solid-state storage device 102 is described in more detail with respect to FIGS. 2 and 3. The solid-state storage device 102 is depicted in a computer 112 connected to a client 114 through a computer network 116. In one embodiment, the solid-state storage device 102 is internal to the computer 112 and is connected using a system communications bus, such as a peripheral component interconnect express ("PCI-e") bus, a Serial Advanced Technology Attachment ("serial ATA") bus, or the like. In another embodiment, the solid-state storage device 102 is external to the computer 112 and is connected using an external communications bus, such as a universal serial bus ("USB") connection, an Institute of Electrical and Electronics Engineers ("IEEE") 1394 bus ("FireWire"), or the like. In other embodiments, the solid-state storage device 102 is connected to the computer 112 using a communications bus such as a peripheral component interconnect ("PCI") express bus using external electrical or optical bus extension or bus networking solution such as Infiniband or PCI Express Advanced Switching ("PCIe-AS"), or the like.

In various embodiments, the solid-state storage device 102 may be in the form of a dual-inline memory module ("DIMM"), a daughter card, or a micro-module. In another embodiment, the solid-state storage device 102 is an element within a rack-mounted blade. In another embodiment, the solid-state storage device 102 is contained within a package that is integrated directly onto a higher level assembly (e.g. mother board, lap top, graphics processor). In another embodiment, individual components comprising the solid-state storage device 102 are integrated directly onto a higher level assembly without intermediate packaging.

The solid-state storage device 102 includes one or more solid-state storage controllers 104, each may include a write data pipeline 106 and a read data pipeline 108 and each includes a solid-state storage media 110, which are described in more detail below with respect to FIGS. 2 and 3.

The system 100 includes one or more computers 112 connected to the solid-state storage device 102. A computer 112 may be a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a computer 112 may be a client and the solid-state storage device 102 operates autonomously to service data requests sent from the computer 112. In this embodiment, the computer 112 and solid-state storage device 102 may be connected using a computer network, system bus, or other communication means suitable for connection between a computer 112 and an autonomous solid-state storage device 102.

In one embodiment, the system 100 includes one or more clients 114 connected to one or more computer 112 through one or more computer networks 116. A client 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 116 may also include a network from the IEEE 802 family of network technologies, such Ethernet, token ring, WiFi, WiMax, and the like.

The computer network 116 may include servers, switches, routers, cabling, radios, and other equipment used to facilitate networking computers 112 and clients 114. In one embodiment, the system 100 includes multiple computers 112 that communicate as peers over a computer network 116. In another embodiment, the system 100 includes multiple solid-state storage devices 102 that communicate as peers over a computer network 116. One of skill in the art will recognize other computer networks 116 comprising one or more computer networks 116 and related equipment with single or redundant connection between one or more clients 114 or other computer with one or more solid-state storage devices 102 or one or more solid-state storage devices 102 connected to one or more computers 112. In one embodiment, the system 100 includes two or more solid-state storage devices 102 connected through the computer network 116 to a client 114 without a computer 112. The solid-state storage controller 104, in certain embodiments, receives source data for storage in the solid-state storage media 110 from a processor of the computer 112 and/or from a client 114 over one or more communications buses as described above.

Solid-State Storage Device

Figure 2:
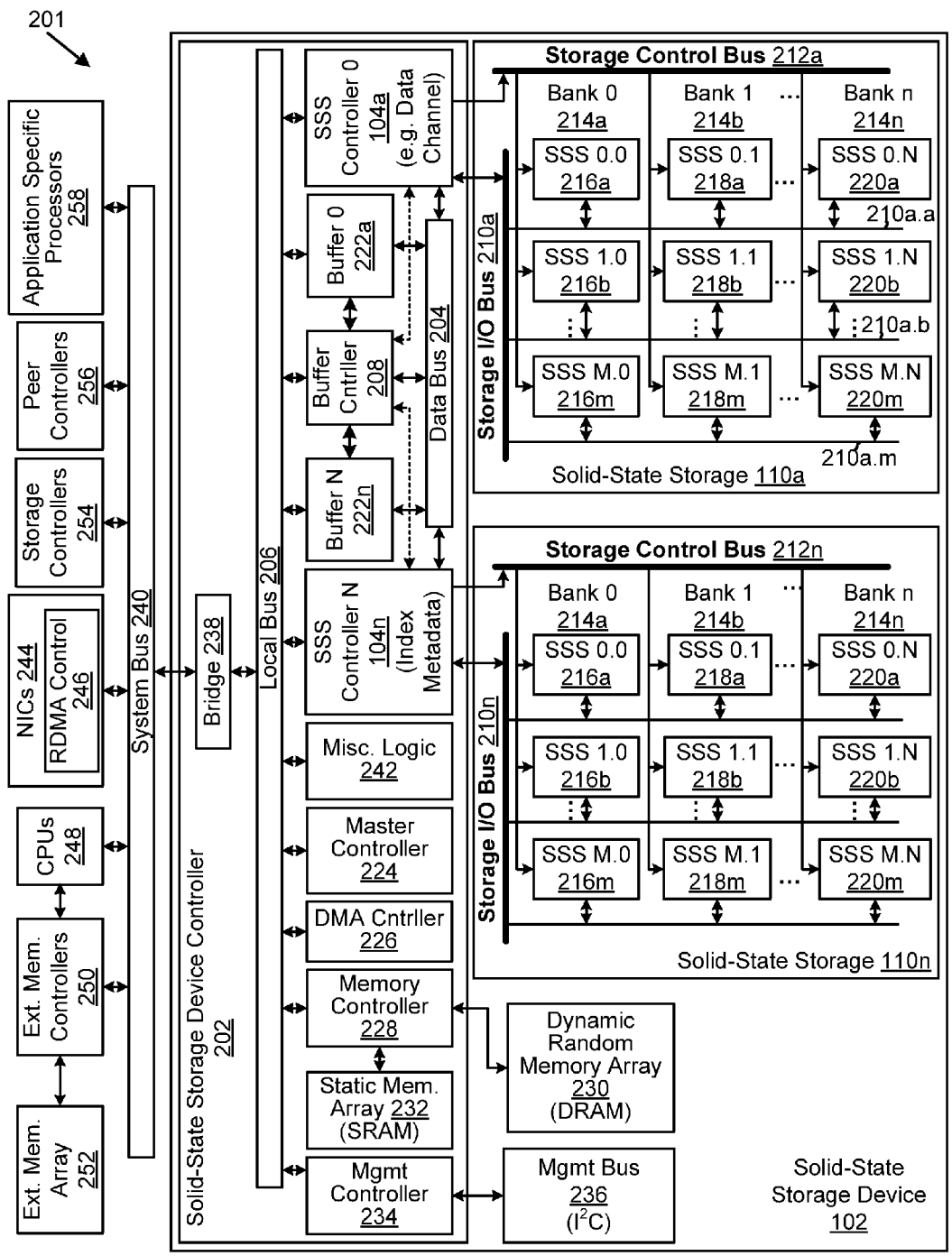
FIG. 2 is a schematic block diagram illustrating one embodiment of a solid-state storage device controller in a solid-state storage device in accordance with the present invention.

FIG. 2 is a schematic block diagram illustrating one embodiment 201 of a solid-state storage device controller 202 that includes a write data pipeline 106 and a read data pipeline 108 in a solid-state storage device 102 in accordance with the present invention. The solid-state storage device controller 202 may include a number of solid-state storage controllers 0-N 104a-n, each controlling solid-state storage media 110. In the depicted embodiment, two solid-state controllers are shown: solid-state controller 0 104a and solid-state storage controller N 104n, and each controls solid-state storage media 110a-n. In the depicted embodiment, solid-state storage controller 0 104a controls a data channel so that the attached solid-state storage media 110a stores data. Solid-state storage controller N 104n controls an index metadata channel associated with the stored data and the associated solid-state storage media 110n stores index metadata. In an alternate embodiment, the solid-state storage device controller 202 includes a single solid-state controller 104a with a single solid-state storage media 110a. In another embodiment, there are a plurality of solid-state storage controllers 104a-n and associated solid-state storage media 110a-n. In one embodiment, one or more solid-state controllers 104a-104n-1, coupled to their associated solid-state storage media 110a-110n-1, control data while at least one solid-state storage controller 104*n*, coupled to its associated solid-state storage media 110*n*, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid-state storage media 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage media 110, data cannot be read from the solid-state storage media 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216*a*) is typically configured as a chip (a package of one or more dies) or a die on a circuit board. As depicted, a solid-state storage element (e.g. 216*a*) operates independently or semi-independently of other solid-state storage elements (e.g. 218*a*) even if these several elements are packaged together in a chip package, a stack of chip packages, or some other package element. As depicted, a column of solid-state storage elements 216, 218, 220 is designated as a bank 214. As depicted, there may be "n" banks 214*a-n* and "m" solid-state storage elements 216*a-m*, 218*a-m*, 220*a-m* per bank in an array of n×m solid-state storage elements 216, 218, 220 in a solid-state storage media 110. In one embodiment, a solid-state storage media 110*a* includes twenty solid-state storage elements per bank (e.g. 216*a-m* in bank 214*a*, 218 *a-m* in bank 214*b*, 220*a-m* in bank 214*n*, where m=22) with eight banks (e.g. 214*a-n* where n=8) and a solid-state storage media 110*n* includes two solid-state storage elements (e.g. 216*a-m* where m=2) per bank 214 with one bank 214*a*. There is no requirement that two solid-state storage media 110*a*, 110*n* have the same number of solid-state storage elements and/or same number of banks 214. In one embodiment, each solid-state storage element 216, 218, 220 is comprised of a single-level cell ("SLC") devices. In another embodiment, each solid-state storage element 216, 218, 220 is comprised of multi-level cell ("MLC") devices.

In one embodiment, solid-state storage elements for multiple banks that share a common storage I/O bus 210*a* row (e.g. 216*b*, 218*b*, 220*b*) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216*a*) may have one or more virtual dies per die and one or more dies per chip and one or more chips stacked vertically and each virtual die may be accessed independently. In another embodiment, a solid-state storage element SSS 0.0 216*a* may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 0.8) 216*a*-220*a*, each in a separate bank 214*a-n*. In another embodiment, 20 storage elements (e.g. SSS 0.0-SSS 20.0) 216 form a virtual bank 214*a* so that each of the eight virtual banks has 20 storage elements (e.g. SSS0.0-SSS 20.8). Data is sent to the solid-state storage media 110 over the storage I/O bus 210 to all storage elements of a particular group of storage elements (SSS 0.0-SSS 0.8) 216*a*, 218*a*, 220*a*. The storage control bus 212*a* is used to select a particular bank (e.g. Bank-0 214*a*) so that the data received over the storage I/O bus 210 connected to all banks 214 is written just to the selected bank 214*a*.

In certain embodiments, the storage control bus 212 and storage I/O bus 210 are used together by the solid-state controller 104 to communicate addressing information, storage element command information, and data to be stored. Those of skill in the art recognize that this address, data, and command information may be communicated using one or the other of these buses 212, 210, or using separate buses for each type of control information. In one embodiment, addressing information, storage element command information, and storage data travel on the storage I/O bus 210 and the storage control bus 212 carries signals for activating a bank as well as identifying whether the data on the storage I/O bus 210 lines constitute addressing information, storage element command information, or storage data.

For example, a control signal on the storage control bus 212 such as "command enable" may indicate that the data on the storage I/O bus 210 lines is a storage element command such as program, erase, reset, read, and the like. A control signal on the storage control bus 212 such as "address enable" may indicate that the data on the storage I/O bus 210 lines is addressing information such as erase block identifier, page identifier, and optionally offset within the page within a particular storage element. Finally, an absence of a control signal on the storage control bus 212 for both "command enable" and "address enable" may indicate that the data on the storage I/O bus 210 lines is storage data that is to be stored on the storage element at a previously addressed erase block, physical page, and optionally offset within the page of a particular storage element.

In one embodiment, the storage I/O bus 210 is comprised of one or more independent I/O buses ("IIOBa-m" comprising 210*a.a-m*, 210*n.a-m*) wherein the solid-state storage elements within each row share one of the independent I/O buses across each solid-state storage element 216, 218, 220 in parallel so that all banks 214 are accessed simultaneously. For example, one IIOB 210*a.a* of the storage I/O bus 210 may access a first solid-state storage element 216*a*, 218*a*, 220*a* of each bank 214*a-n* simultaneously. A second IIOB 210*a.b* of the storage I/O bus 210 may access a second solid-state storage element 216*b*, 218*b*, 220*b* of each bank 214*a-n* simultaneously. Each row of solid-state storage elements 216, 218, 220 is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220 using either of the chip select signal and the chip enable signal. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. A typical page is 2000 bytes ("2 kB"). In one example, a solid-state storage element (e.g. SSS0.0) includes two registers and can program two pages so that a two-register solid-state storage element has a page size of 4 kB. A single bank 214a of 20 solid-state storage elements 216a-m would then have an 80 kB capacity of pages accessed with the same address going out of the storage I/O bus 210.

This group of pages in a bank 214 of solid-state storage elements 216, 218, 220 of 80 kB may be called a logical or virtual page. Similarly, an erase block of each storage element 216a-m of a bank 214a may be grouped to form a logical erase block. In one embodiment, erasing a logical erase block causes a physical erase block of each storage element 216a-m of a bank 214a to be erased. In one embodiment, an erase block of pages within a solid-state storage element 216, 218, 220 is erased when an erase command is received within a solid-state storage element 216, 218, 220. In another embodiment, a single physical erase block on each storage element (e.g. SSS M.N) collectively forms a logical erase block for the solid-state storage media 110a. In such an embodiment, erasing a logical erase block comprises erasing an erase block at the same address within each storage element (e.g. SSS M.N) in the solid-state storage media array 110a. Whereas the size and number of erase blocks, pages, planes, or other logical and physical divisions within a solid-state storage element 216, 218, 220 may change over time with advancements in technology, it is to be expected that many embodiments consistent with new configurations are possible and are consistent with the general description herein.

In one embodiment, data is written in packets to the storage elements. The solid-state controller 104 uses the storage I/O bus 210 and storage control bus 212 to address a particular bank 214, storage element 216, 218, 220, physical erase block, physical page, and optionally offset within a physical page for writing the data packet. In one embodiment, the solid-state controller 104 sends the address information for the data packet by way of the storage I/I bus 210 and signals that the data on the storage I/O bus 210 is address data by way of particular signals set on the storage control bus 212. The solid-state controller 104 follows the transmission of the address information with transmission of the data packet of data that is to be stored. The physical address contains enough information for the solid-state storage element 216, 218, 220 to direct the data packet to the designated location within the page.

In one embodiment, the storage I/O bus 210a.a connects to each storage element in a row of storage elements (e.g. SSS 0.0-SSS 0.N 216a, 218a, 220a). In such an embodiment, the solid-state controller 104a activates a desired bank 214a using the storage control bus 212a, such that data on storage I/O bus 210a.a reaches the proper page of a single storage element (e.g. SSS 0.0 216a).

In addition, in certain embodiments, the solid-state controller 104a simultaneously activates the same bank 214a using the storage control bus 212a, such that different data (a different data packet) on storage I/O bus 210a.b reaches the proper page of a single storage element on another row (e.g. SSS 1.0 216b). In this manner, multiple physical pages of multiple storage elements 216, 218, 220 may be written to simultaneously within a single bank 214 to store a logical page.

Similarly, a read command may require a command on the storage control bus 212 to select a single bank 214a and the appropriate page within that bank 214a. In one embodiment, a read command reads an entire physical page from each storage element, and because there are multiple solid-state storage elements 216, 218, 220 in parallel in a bank 214, an entire logical page is read with a read command. However, the read command may be broken into subcommands, as will be explained below with respect to bank interleave. A logical page may also be accessed in a write operation.

In one embodiment, a solid-state controller 104 may send an erase block erase command over all the lines of the storage I/O bus 210 to erase a physical erase block having a particular erase block address. In addition, the solid-state controller 104 may simultaneously activate a single bank 214 using the storage control bus 212 such that each physical erase block in the single activated bank 214 is erased as part of a logical erase block.

In another embodiment, the solid-state controller 104 may send an erase block erase command over all the lines of the storage I/O bus 210 to erase a physical erase block having a particular erase block address on each storage element 216, 218, 220 (SSS 0.0-SSS M.N). These particular physical erase blocks together may form a logical erase block. Once the address of the physical erase blocks is provided to the storage elements 216, 218, 220, the solid-state controller 104 may initiate the erase command on a bank 214a by bank 214b by bank 214n basis (either in order or based on some other sequence). Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, the storage controller 104 sequentially writes data on the solid-state storage media 110 in a log structured format and within one or more physical structures of the storage elements, the data is sequentially stored on the solid-state storage media 110. Sequentially writing data involves the storage controller 104 streaming data packets into storage write buffers for storage elements, such as a chip (a package of one or more dies) or a die on a circuit board. When the storage write buffers are full, the data packets are programmed to a designated virtual or logical page ("LP"). Data packets then refill the storage write buffers and, when full, the data packets are written to the next LP. The next virtual page may be in the same bank 214a or another bank (e.g. 214b). This process continues, LP after LP, typically until a virtual or logical erase block ("LEB") is filled. LPs and LEBs are described in more detail below.

In another embodiment, the streaming may continue across LEB boundaries with the process continuing, LEB after LEB. Typically, the storage controller 104 sequentially stores data packets in an LEB by order of processing. In one embodiment, where a write data pipeline 106 is used, the storage controller 104 stores packets in the order that they come out of the write data pipeline 106. This order may be a result of data segments arriving from a requesting device mixed with packets of valid data that are being read from another storage location as valid data is being recovered from another LEB during a recovery operation.

The sequentially stored data may act as a log to reconstruct data indexes and other metadata using information from data packet headers. For example, in one embodiment, the storage controller 104 may reconstruct an storage index by reading headers to determine the data structure to which each packet belongs and sequence information to determine where in the data structure the data or metadata belongs. The storage controller 104, in one embodiment, uses physical address information for each packet and timestamp or sequence information to create a mapping between the physical locations of the packets and the data structure identifier and data segment sequence. Timestamp or sequence information is used by the storage controller 104 to replay the sequence of changes made to the index and thereby reestablish the most recent state.

In one embodiment, erase blocks are time stamped or given a sequence number as packets are written and the timestamp or sequence information of an erase block is used along with information gathered from container headers and packet headers to reconstruct the storage index. In another embodiment, timestamp or sequence information is written to an erase block when the erase block is recovered.

In a read, modify, write operation, data packets associated with the logical structure are located and read in a read operation. Data segments of the modified structure that have been modified are not written to the location from which they are read. Instead, the modified data segments are again converted to data packets and then written to the next available location in the virtual page currently being written. Index entries for the respective data packets are modified to point to the packets that contain the modified data segments. The entry or entries in the index for data packets associated with the same logical structure that have not been modified will include pointers to original location of the unmodified data packets. Thus, if the original logical structure is maintained, for example to maintain a previous version of the logical structure, the original logical structure will have pointers in the index to all data packets as originally written. The new logical structure will have pointers in the index to some of the original data packets and pointers to the modified data packets in the virtual page that is currently being written.

In a copy operation, the index includes an entry for the original logical structure mapped to a number of packets stored in the solid-state storage media 110. When a copy is made, a new logical structure is created and a new entry is created in the index mapping the new logical structure to the original packets. The new logical structure is also written to the solid-state storage media 110 with its location mapped to the new entry in the index. The new logical structure packets may be used to identify the packets within the original logical structure that are referenced in case changes have been made in the original logical structure that have not been propagated to the copy and the index is lost or corrupted. In another embodiment, the index includes a logical entry for a logical block.

Beneficially, sequentially writing packets facilitates a more even use of the solid-state storage media 110 and allows the solid-storage device controller 202 to monitor storage hot spots and level usage of the various virtual pages in the solid-state storage media 110. Sequentially writing packets also facilitates a powerful, efficient garbage collection system, which is described in detail below. One of skill in the art will recognize other benefits of sequential storage of data packets.

The system 100 may comprise a log-structured storage system or log-structured array similar to a log-structured file system and the order that data is stored may be used to recreate an index. Typically an index that includes a logical-to-physical mapping is stored in volatile memory. If the index is corrupted or lost, the index may be reconstructed by addressing the solid-state storage media 110 in the order that the data was written. Within a logical erase block ("LEB"), data is typically stored sequentially by filling a first logical page, then a second logical page, etc. until the LEB is filled. The solid-state storage controller 104 then chooses another LEB and the process repeats. By maintaining an order that the LEBs were written to and by knowing that each LEB is written sequentially, the index can be rebuilt by traversing the solid-state storage media 110 in order from beginning to end. In other embodiments, if part of the index is stored in non-volatile memory, such as on the solid-state storage media 110, the solid-state storage controller 104 may only need to replay a portion of the solid-state storage media 110 to rebuild a portion of the index that was not stored in non-volatile memory. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222*a-n*, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the computer 112 or may be other devices.

In one embodiment, the solid-state storage controller(s) 104 communicate data to the solid-state storage media 110 over a storage I/O bus 210. In a certain embodiment where the solid-state storage is arranged in banks 214 and each bank 214 includes multiple storage elements 216, 218, 220 accessible in parallel, the storage I/O bus 210 comprises an array of busses, one for each row of storage elements 216, 218, 220 spanning the banks 214. As used herein, the term "storage I/O bus" may refer to one storage I/O bus 210 or an array of data independent busses 204. In one embodiment, each storage I/O bus 210 accessing a row of storage elements (e.g. 216*a*, 218*a*, 220*a*) may include a logical-to-physical mapping for storage divisions (e.g. erase blocks) accessed in a row of storage elements 216*a*, 218*a*, 220*a*. This mapping allows a logical address mapped to a physical address of a storage division to be remapped to a different storage division if the first storage division fails, partially fails, is inaccessible, or has some other problem. Remapping is explained further in relation to the remapping module 430 of FIG. 4.

Data may also be communicated to the solid-state storage controller(s) 104 from a requesting device 155 through the system bus 240, bridge 238, local bus 206, buffer(s) 222, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device 155 can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage media 110 such as NAND flash or other storage media. In one embodiment, data and associated out-of-band metadata ("object metadata") arriving with the data is communicated using one or more data channels comprising one or more solid-state storage controllers 104a-104n-1 and associated solid-state storage media 110a-110n-1 while at least one channel (solid-state storage controller 104n, solid-state storage media 110n) is dedicated to in-band metadata, such as index information and other metadata generated internally to the solid-state storage device 102.

The local bus 206 is typically a bidirectional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204 and bridges 238.

The system bus 240 is typically a bus of a computer 112 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting object requests and other requests, directs creation of indexes to map object identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller 224.

In one embodiment, where the storage controller 152/solid-state storage device controller 202 manages multiple data storage devices/solid-state storage media 110a-n, the master controller 224 divides the work load among internal controllers, such as the solid-state storage controllers 104a-n. For example, the master controller 224 may divide an object to be written to the data storage devices (e.g. solid-state storage media 110a-n) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects, emulates block storage such that a computer 112 or other device connected to the storage device/solid-state storage device 102 views the storage device/solid-state storage device 102 as a block storage device and sends data to specific physical addresses in the storage device/solid-state storage device 102. The master controller 224 then divides up the blocks and stores the data blocks as it would objects. The master controller 224 then maps the blocks and physical address sent with the block to the actual locations determined by the master controller 224. The mapping is stored in the object index. Typically, for block emulation, a block device application program interface ("API") is provided in a driver in the computer 112, client 114, or other device wishing to use the storage device/solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a client 114 may have access to the computer network 116 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/solid-state storage devices 102, the master controller 224 may be a RAID controller for single tier RAID, multi-tier RAID, progressive RAID, etc. The master controller 224 also allows some objects to be stored in a RAID array and other objects to be stored without RAID. In another embodiment, the master controller 224 may be a distributed RAID controller element. In another embodiment, the master controller 224 may comprise many RAID, distributed RAID, and other functions as described elsewhere.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 116) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/solid-state storage device 102 may autonomously manage objects and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple virtual devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 152, or more specifically in a solid-state storage device 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the object index is stored in memory 230, 232 and then periodically off-loaded to a channel of the solid-state storage media 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition the DMA controller 226 may also control RDMA operations with requesting devices through a NIC 244 and associated RDMA controller 246.

In one embodiment, the solid-state storage device controller 202 includes a management controller 234 connected to a management bus 236. Typically the management controller 234 manages environmental metrics and status of the storage device/solid-state storage device 102. The management controller 234 may monitor device temperature, fan speed, power supply settings, etc. over the management bus 236. The management controller 234 may support the reading and programming of erasable programmable read only memory ("EEPROM") for storage of FPGA code and controller software. Typically the management bus 236 is connected to the various components within the storage device/solid-state storage device 102. The management controller 234 may communicate alerts, interrupts, etc. over the local bus 206 or may include a separate connection to a system bus 240 or other bus. In one embodiment the management bus 236 is an Inter-Integrated Circuit ("I²C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically where the solid-state device controller 202 or master controller 224 is/are configured using a FPGA or other configurable controller, custom logic may be included based on a particular application, customer requirement, storage requirement, etc.

Data Pipeline

Figure 3:
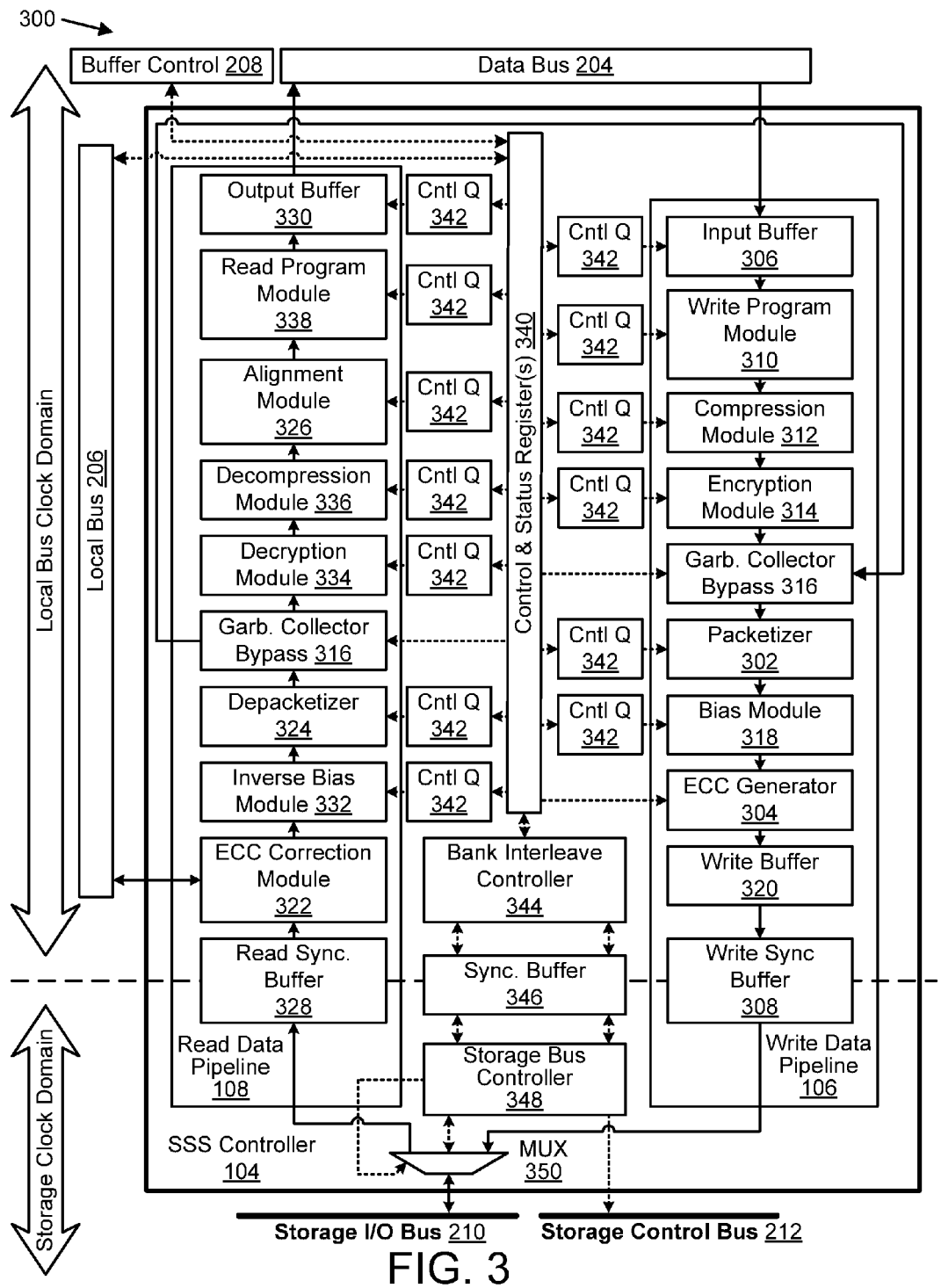
FIG. 3 is a schematic block diagram illustrating one embodiment of a solid-state storage controller with a write data pipeline and a read data pipeline in a solid-state storage device in accordance with the present invention.

FIG. 3 is a schematic block diagram illustrating one embodiment 300 of a solid-state storage controller 104 with a write data pipeline 106 and a read data pipeline 108 in a solid-state storage device 102 in accordance with the present invention. The embodiment 300 includes a data bus 204, a local bus 206, and buffer control 208, which are substantially similar to those described in relation to the solid-state storage device controller 202 of FIG. 2. The write data pipeline 106 includes a packetizer 302 and an error-correcting code ("ECC") generator 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a bias module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include an inverse bias module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage media 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage media 110. The data or metadata segment is typically part of an object, but may also include an entire object. In another embodiment, the data segment is part of a block of data, but may also include an entire block of data. Typically, a set of data such as an object is received from a computer 112, client 114, or other computer or device and is transmitted to the solid-state storage device 102 in data segments streamed to the solid-state storage device 102 or computer 112. A data segment may also be known by another name, such as data parcel, but as referenced herein includes all or a portion of an object, data block, or data packet.

Each object is stored as one or more packets. Each object may have one or more container packets. Each packet contains a header. The header may include a header type field. Type fields may include data, object attribute, metadata, data segment delimiters (multi-packet), object structures, object linkages, and the like. The header may also include information regarding the size of the packet, such as the number of bytes of data included in the packet. The length of the packet may be established by the packet type. The header may include information that establishes the relationship of the packet to the object. An example might be the use of an offset in a data packet header to identify the location of the data segment within the object. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the object to which the packet belongs. For example, the header may include an object identifier and offset that indicates the data segment, object, or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the object when reconstructing the data segment or object. The header may include a header type field. Type fields may include data, object attributes, metadata, data segment delimiters (multi-packet), object structures, object linkages, and the like. One of skill in the art will recognize other information that may be included in a header added to data or metadata by a packetizer 302 and other information that may be added to a packet.

The write data pipeline 106 includes an ECC generator 304 that that generates one or more error-correcting codes ("ECC") for the one or more packets received from the packetizer 302. The ECC generator 304 typically uses an error correcting algorithm to generate ECC check bits which are stored with the one or more data packets. The ECC codes generated by the ECC generator 304 together with the one or more data packets associated with the ECC codes comprise an ECC chunk. The ECC data stored with the one or more data packets is used to detect and to correct errors introduced into the data through transmission and storage. In one embodiment, packets are streamed into the ECC generator 304 as un-encoded blocks of length N. A syndrome of length S is calculated, appended and output as an encoded block of length N+S. The value of N and S are dependent upon the characteristics of the algorithm which is selected to achieve specific performance, efficiency, and robustness metrics. In one embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In one embodiment, ECC algorithms are not dynamically modified. In one embodiment, the ECC data stored with the data packets is robust enough to correct errors in more than two bits.

Beneficially, using a robust ECC algorithm allowing more than single bit correction or even double bit correction allows the life of the solid-state storage media 110 to be extended. For example, if flash memory is used as the storage medium in the solid-state storage media 110, the flash memory may be written approximately 100,000 times without error per erase cycle. This usage limit may be extended using a robust ECC algorithm. Having the ECC generator 304 and corresponding ECC correction module 322 onboard the solid-state storage device 102, the solid-state storage device 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage media 110 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage media 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the solid-state storage device 102 but outside the write data pipeline 106, in the computer 112, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage media 110. The write synch buffer 308 is located at a boundary between a local clock domain and a solid-state storage clock domain and provides buffering to account for the clock domain differences. In other embodiments, synchronous solid-state storage media 110 may be used and synchronization buffers 308 328 may be eliminated.

In one embodiment, the write data pipeline 106 also includes a bias module 318 that receives the one or more packets from the packetizer 302, either directly or indirectly. The bias module 318 biases the bits of the data packets toward a bias of storage cells of the solid-state storage media 110. As used herein, a "bias" is a preference, probability, tendency, or desirability of values for bits within a set of bits to exhibit a specific data pattern. A bias may be a natural property, a designed attribute, a property of performing an operation on storage media, or a random occurrence. Data itself may have a bias and data storage media may have a bias. A bias may be toward binary ones, toward binary zeroes, toward a balance of binary ones and zeroes, toward a certain binary value for certain bits, or the like.

For example, in one embodiment, end sections of data files may be padded with binary zeroes, causing the data packets that store the end sections to exhibit a bias toward binary zeroes, meaning that the data packets have more binary zeroes than binary ones. Other data packets may have more binary ones than zeroes, or a balance of binary ones and zeroes. While data packets may each have an individual bias based on data within the packets, a bias of the storage cells of the solid-state storage media 110 may be based on some benefit associated with the storage of a particular binary value or pattern, or some property of the storage cells. One example of a storage cell property, NAND flash storage cells presently are biased to all binary one values or almost all binary one values when provided by a manufacturer. In addition, performing an erase operation on the NAND flash storage cells sets the binary values in each storage cell to a binary one, such that programming of the storage cells comprises changing certain storage cells to a binary zero value. This bias to all binary one values or almost all binary one values when provided by a manufacturer or when erased represents one example of an empty state for storage cells of a non-volatile solid-state storage media.

Each of the storage elements 216, 218, 220, in one embodiment, store binary data in a plurality of storage cells that exhibit a bias. Each storage cell stores one or more binary bits, or values. Flash memory storage cells may be single-level cells ("SLC") that each store a single binary bit, or multi-level cells ("MLC") that each store two or more binary bits. Examples of storage cells include transistors, capacitors, magnetic elements, mechanical elements, optical elements, and the like. In flash memory, each storage cell is typically a floating-gate transistor. NRAM, MRAM, DRAM, PRAM, and other types of solid-state storage may have other types of storage cells, and may store either a single binary bit or two or more binary bits per storage cell.

In one embodiment, the storage cells in the storage elements 216, 218, 220 in an empty or erased state store initial binary values. The initial binary values represent a bias for the storage cells. For example, the storage cells may have a physical, electrical, mechanical, or other quality that causes them to store a certain value by default. In another embodiment, the bias may be intentionally selected based on design considerations of the solid-state storage media 110, on security considerations, on compatibility issues, or the like, and may not be based on a default property of the storage cells.

For example, in one embodiment, the storage cells of the storage elements 216, 218, 220 may each store a binary value of one upon delivery from a manufacturer, and may each be erased to a value of one prior to being programmed, or written to, as is typical with flash memory. In another embodiment, the storage cells of the storage elements 216, 218, 220 may be biased toward binary zeroes, toward a balance or equal amount of binary ones and zeroes, toward a certain binary value for a plurality of bits, toward a binary pattern, or the like. The process of erasing a logical erase block in a bank 214 of the solid-state storage media 110 is described in greater detail below with regard to FIG. 4.

In certain embodiments, a bias of one or more storage cells may be influenced by or based on a state of other storage cells physically adjacent to or otherwise in proximity to the one or more storage cells. For example, it may be desirable to bias data stored in storage cells to minimize inter-cell interference between the storage cells and other storage cells, or the like.

Inter-cell interference can be caused by voltage differentials between physically adjacent storage cells and, in certain embodiments, biasing data to reduce or minimize the voltage differentials between storage cells based on a physical geometry of the storage cells can reduce inter-cell interference. In one embodiment, storage cells of the solid-state storage media 110 may have a bias toward a binary pattern that satisfies a predefined voltage differential threshold between the storage cells and other physically adjacent storage cells, or the like.

In addition to local types of inter-cell interference, larger multi-cell structures, such as bit strings, word lines, or the like, may experience inter-cell interference. Certain stripes or other patterns in data, such as stripes of binary ones or of binary zeroes, may interfere with the accuracy or effectiveness of sense amplifiers and/or other management circuitry for these larger, multi-cell structures, and it may be advantageous to bias data away from such stripes or other patterns.

For certain types of storage cells, such as SLC flash memory, the voltage level of a storage cell and associated voltage differentials between storage cells may be based on a single bit value for each storage cell and biasing data may include biasing toward a binary pattern with minimal transitions between binary one values and binary zero values within a data packet and/or within a physical region of storage cells. For other types of storage cells, such as MLC flash memory, the voltage level of a storage cell and associated voltage differentials between storage cells may be based on groups of bits forming a sub-pattern or symbol, and biasing data may include biasing toward a binary pattern with minimal transitions between certain sub-patterns or symbols. One example of using sub-patterns or symbols includes binary or gray-code mapping of multiple binary values to associated charge levels within MLC storage cells.

In one embodiment, the bias module 318 biases source data to reduce inter-cell interference as a separate step performed separately from, instead of, or in addition to other biasing techniques. For example, upon flipping, whitening, compressing, relocating, and/or otherwise biasing source data, separate blocks of source data may still exhibit patterns that cause inter-cell interference, and the bias module 318 may bias one or more of the separate blocks of source data toward a pattern that minimizes inter-cell interference, or the like.

The bias module 318 biases a packet by changing a bias of the packet to more closely match a bias of the storage cells of the solid state storage media 110. The bias module 318 biases the packets in a reversible manner, such that the inverse bias module 332 can convert the packets back to their original source data values with their original source biases. In one embodiment, the packets that the bias module 318 biases are sized for storage in a specific logical or physical storage region or division of the solid-state storage media 110, such as an erase block, a virtual erase block, a page, a virtual page, an ECC chunk, a division within a page, or the like. In one embodiment, the bias module 318 selectively biases certain packets based on a bias of the packets, and may not bias other packets. The bias module 318 is described in greater detail below with regard to FIG. 5A.

Those of skill in the art recognize that the bias module 318 may, alternatively, operate on one or more data segments that form a subset of a data packet. Similarly, the inverse bias module 332 may operate on data segments as well. Alternatively, or in addition, in one embodiment, the data packet (or data packet subsets such as a data segment) may be sized based on a size of a storage region in the solid-state storage media 110, a size of a bus or buffer, a size of a pipeline 106, 108, a number of extra bits available for storage of an indicator, or the like.

By biasing data packets toward the bias of the storage cells, the bias module 318 increases performance and endurance of the solid-state storage media 110 and the solid-state storage device 102. For example, biasing packets to more closely match the bias of the storage cells decreases write times and erase times because fewer actual storage cells must be changed to execute the operation. It also increases the writable life of the storage cells because fewer operations that are executed on a storage cell mean that the storage cell will last longer before wear begins to affect the storage cell performance/reliability. In certain embodiments, biasing data packets may decrease power consumption or have other additional benefits. Because, in one embodiment, the storage cells store initial binary values that satisfy a bias just prior to being programmed or written to, the closer that the data packets match the bias of the storage cells, the fewer the number of storage cells that are changed to store the data packets, and the more storage cells that remain in a biased state.

As depicted, the bias module 318 biases the one or more packets prior to sending the packets to the ECC generator 304. Depending on the method that the bias module 318 uses to bias the packets, and on other design considerations, in a further embodiment, the bias module 318 may receive data subsequent to the ECC generator 304 in the write data pipeline 106, or be placed elsewhere in the write data pipeline 106. For example, in certain embodiments, it may be beneficial to keep ECC data separate from data that the bias module 318 biases, while in other embodiments it may be beneficial for the bias module 318 to bias data that includes ECC data from the ECC generator 304.

In one embodiment, the bias module 318 biases one or more data segments prior to sending the data segments to the ECC generator 304. The data segment may be a grouping of bits smaller than a data packet in one embodiment. In such an embodiment, the data segment may comprise the width in bits/bytes of the write data pipeline 106. Similarly, the inverse bias module 332 may convert biased data segments back to their original source state after they are read. Biasing and inverse biasing a data segment may facilitate use of the bias module 318 and the inverse bias module 332 in a write data pipeline 106 and a read data pipeline 108 because the data segment may be sized to match the size (bus width) of data streaming through the pipelines 106,108.

In another embodiment, the bias module 318 may be integrated with another element of the write data pipeline 106, such as the compression module 312, the encryption module 314, the ECC generator 304, or the like. The bias module 318 and corresponding inverse bias module 332 transparently increase the performance of the solid-state storage media 110 as the bias module 318 biases data packets before they are written and the inverse bias module 332 converts the biased data packets back to their original source state after they are read.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption keys used by the encryption module 314 to encrypt data may not be common to all data stored within the solid-state storage device 102 but may vary on an object basis and received in conjunction with receiving data segments as described below. For example, an encryption key for a data segment to be encrypted by the encryption module 314 may be received with the data segment or may be received as part of a command to write an object to which the data segment belongs. The solid-sate storage device 102 may use and store a non-secret cryptographic nonce in each object packet that is used in conjunction with the encryption key. A different nonce may be stored with every packet. Data segments may be split between multiple packets with unique nonces for the purpose of improving protection by the encryption algorithm.

The encryption key may be received from a client 114, a computer 112, key manager, or other device that holds the encryption key to be used to encrypt the data segment. In one embodiment, encryption keys are transferred to the solid-state storage controller 104 from one of a solid-state storage device 102, computer 112, client 114, or other external agent which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the solid-state storage device 102 allows object-by-object or segment-by-segment data encryption without a single file system or other external system to keep track of the different encryption keys used to store corresponding objects or data segments. Each requesting device 155 or related key manager independently manages encryption keys used to encrypt only the objects or data segments sent by the requesting device 155.

In one embodiment, the encryption module 314 may encrypt the one or more packets using an encryption key unique to the solid-state storage device 102. The encryption module 314 may perform this media encryption independently, or in addition to the encryption described above. Typically, the entire packet is encrypted, including the headers. In another embodiment, headers are not encrypted. The media encryption by the encryption module 314 provides a level of security for data stored in the solid-state storage media 110. For example, where data is encrypted with media encryption unique to the specific solid-state storage device 102, if the solid-state storage media 110 is connected to a different solid-state storage controller 104, solid-state storage device 102, or computer 112, the contents of the solid-state storage media 110 typically could not be read without use of the same encryption key used during the write of the data to the solid-state storage media 110 without significant effort.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the solid-state storage device 102 is beneficial so that clients 114 or other devices writing data to the solid-state storage device 102 may each specify a compression routine or so that one can specify a compression routine while another specifies no compression. Selection of compression routines may also be selected according to default settings on a per object type or object class basis. For example, a first object of a specific object may be able to override default compression routine settings and a second object of the same object class and object type may use the default compression routine and a third object of the same object class and object type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In one embodiment, the garbage collector bypass 316 is part of an autonomous garbage collector system that operates within the solid-state storage device 102. This allows the solid-state storage device 102 to manage data so that data is systematically spread throughout the solid-state storage media 110 to improve performance, data reliability and to avoid overuse and underuse of any one location or area of the solid-state storage media 110 and to lengthen the useful life of the solid-state storage media 110.

The garbage collector bypass 316 coordinates insertion of segments into the write data pipeline 106 with other segments being written by clients 114 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 108 to fill the remainder of the virtual page in order to improve the efficiency of storage within the solid-state storage media 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the solid-state storage media 110. This allows a write operation to send an entire page of data to the solid-state storage media 110 without interruption. By sizing the write buffer 320 of the write data pipeline 106 and buffers within the read data pipeline 108 to be the same capacity or larger than a storage write buffer within the solid-state storage media 110, writing and reading data is more efficient since a single write command may be crafted to send a full virtual page of data to the solid-state storage media 110 instead of multiple commands.

While the write buffer 320 is being filled, the solid-state storage media 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a virtual page of data segments. One of skill in the art will recognize other write buffer 320 configurations that allow a virtual page of data to be stored prior to writing the data to the solid-state storage media 110.

In another embodiment, the write buffer 320 is sized smaller than a virtual page so that less than a page of information could be written to a storage write buffer in the solid-state storage media 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage media 110 to fill the pages of a virtual page prior to programming the data. In this way a data stall in the write data pipeline 106 would not stall reading from the solid-state storage device 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the solid-state storage media 110 by using ECC stored with each ECC block of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the solid-state storage media 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In one embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the object to which the packet belongs. In another embodiment, the solid-state storage controller 104 stores data using some type of RAID and is able to recover the corrupted data. In another embodiment, the ECC correction module 322 sends an interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required by the object index reconstruction module 272. Further examples include the transfer of packets of various types destined for use within the solid-state storage device 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage media 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of an object in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device 155, the alignment module 326 may discard the unwanted data.

In one embodiment, the read data pipeline 108 includes a read synchronization buffer 328 that buffers one or more requested packets read from the solid-state storage media 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device 155. The output buffer 330 accounts for differences between when data segments are received from stages of the read data pipeline 108 and when the data segments are transmitted to other parts of the solid-state storage controller 104 or to the requesting device 155. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes an inverse bias module 332 that receives one or more requested biased packets from the ECC correction module 322 and converts the one or more requested packets back to their original source form by reversing the biasing process of the bias module 318 prior to sending the one or more requested packets to the depacketizer 324. In one embodiment, the inverse bias module 332 may use one or more indicators stored by the bias module 318 to convert the biased packets back to their original source data.

In a further embodiment, the inverse bias module 332 converts the biased packets back to their original source data without using an indicator. Instead of using an indicator, the inverse bias module 332 may implement an algorithm that is the inverse operation of the bias module 318. This algorithm may inverse the bias for each data packet received and/or a select number of data packets received. In the depicted embodiment, the inverse bias module 332 is located between the ECC correction module 322 and the depacketizer 324. In a further embodiment, the inverse bias module 332 may be located elsewhere in the read data pipeline 108, based on the location of the bias module 318 in the write data pipeline 106. The inverse bias module 332 is described in greater detail with regard to FIG. 5B.

In another embodiment, the read data pipeline 108 includes a decryption module 334 that decrypts a data segment formatted by the depacketizer 324 prior to sending the data segment to the output buffer 330. The data segment may be decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. When the packet was stored with a non-secret cryptographic nonce, the nonce is used in conjunction with an encryption key to decrypt the data packet. The encryption key may be received from a client 114, a computer 112, key manager, or other device that manages the encryption key to be used by the solid-state storage controller 104.

In another embodiment, the read data pipeline 108 includes a decompression module 336 that decompresses a data segment formatted by the depacketizer 324. In one embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per object type or object class basis. A first packet of a first object may be able to override a default decompression routine and a second packet of a second object of the same object class and object type may use the default decompression routine and a third packet of a third object of the same object class and object type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

Figure 4:
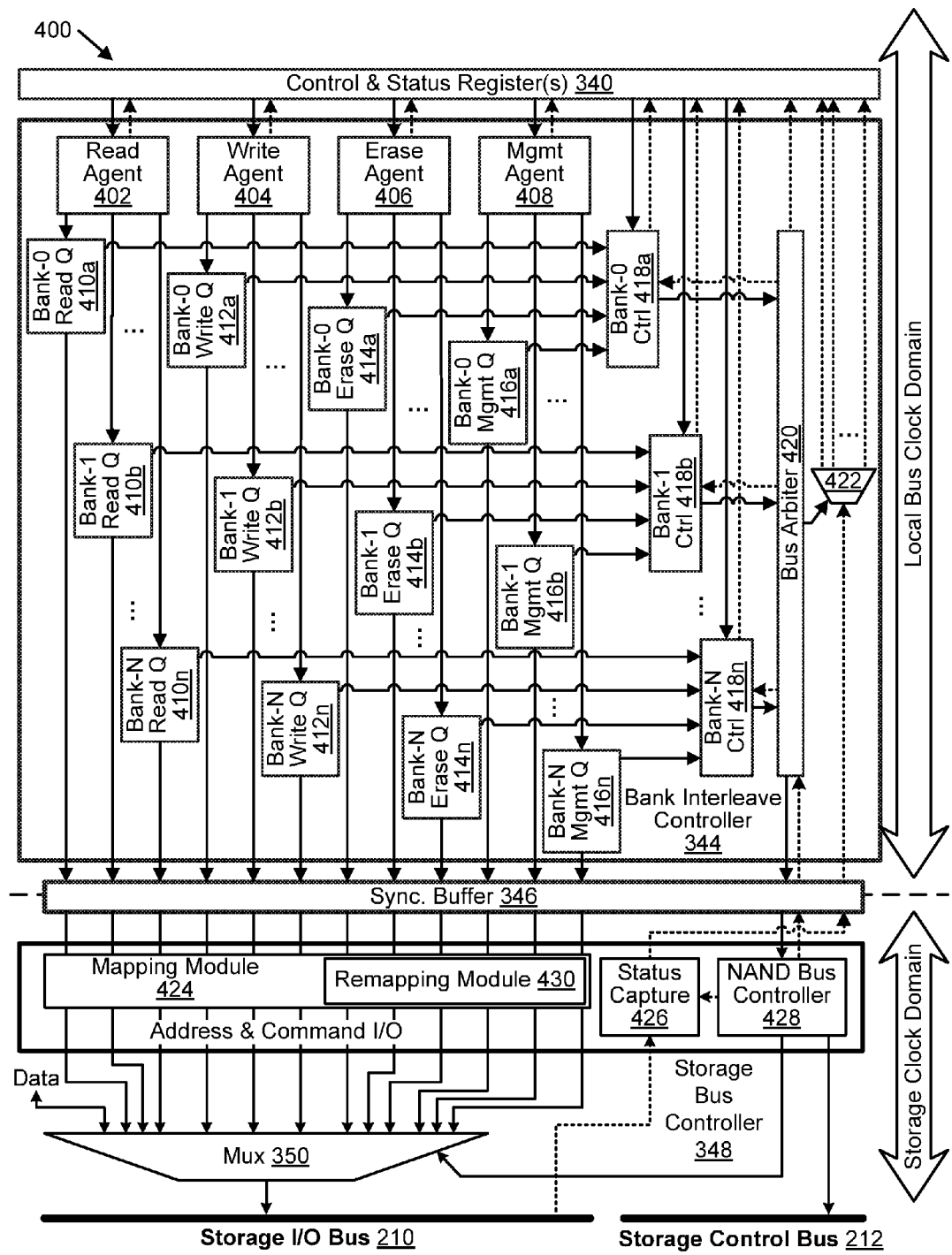
FIG. 4 is a schematic block diagram illustrating one embodiment of a bank interleave controller in the solid-state storage controller in accordance with the present invention.

The solid-state storage controller 104 and or solid-state storage device 102 may also include a bank interleave controller 344, a synchronization buffer 346, a storage bus controller 348, and a multiplexer ("MUX") 350, which are described in relation to FIG. 4.

Bank Interleave

FIG. 4 is a schematic block diagram illustrating one embodiment 400 of a bank interleave controller 344 in the solid-state storage controller 104 in accordance with the present invention. The bank interleave controller 344 is connected to the control and status registers 340 and to the storage I/O bus 210 and storage control bus 212 through the MUX 350, storage bus controller 348, and synchronization buffer 346, which are described below. The bank interleave controller 344 includes a read agent 402, a write agent 404, an erase agent 406, a management agent 408, read queues 410a-n, write queues 412a-n, erase queues 414a-n, and management queues 416a-n for the banks 214 in the solid-state storage media 110, bank controllers 418a-n, a bus arbiter 420, and a status MUX 422, which are described below. The storage bus controller 348 includes a mapping module 424 with a remapping module 430, a status capture module 426, and a NAND bus controller 428, which are described below.

The bank interleave controller 344 directs one or more commands to two or more queues in the bank interleave controller 104 and coordinates among the banks 214 of the solid-state storage media 110 execution of the commands stored in the queues, such that a command of a first type executes on one bank 214a while a command of a second type executes on a second bank 214b. The one or more commands are separated by command type into the queues. Each bank 214 of the solid-state storage media 110 has a corresponding set of queues within the bank interleave controller 344 and each set of queues includes a queue for each command type.

The bank interleave controller 344 coordinates among the banks 214 of the solid-state storage media 110 execution of the commands stored in the queues. For example, a command of a first type executes on one bank 214a while a command of a second type executes on a second bank 214b. Typically the command types and queue types include read and write commands and queues 410, 412, but may also include other commands and queues that are storage media specific. For example, in the embodiment depicted in FIG. 4, erase and management queues 414, 416 are included and would be appropriate for flash memory, NRAM, MRAM, DRAM, PRAM, etc.

For other types of solid-state storage media 110, other types of commands and corresponding queues may be included without straying from the scope of the invention. The flexible nature of an FPGA solid-state storage controller 104 allows flexibility in storage media. If flash memory were changed to another solid-state storage type, the bank interleave controller 344, storage bus controller 348, and MUX 350 could be altered to accommodate the media type without significantly affecting the data pipelines 106, 108 and other solid-state storage controller 104 functions.

In the embodiment depicted in FIG. 4, the bank interleave controller 344 includes, for each bank 214, a read queue 410 for reading data from the solid-state storage media 110, a write queue 412 for write commands to the solid-state storage media 110, an erase queue 414 for erasing an erase block in the solid-state storage, an a management queue 416 for management commands. The bank interleave controller 344 also includes corresponding read, write, erase, and management agents 402, 404, 406, 408. In another embodiment, the control and status registers 340 and control queues 342 or similar components queue commands for data sent to the banks 214 of the solid-state storage media 110 without a bank interleave controller 344.

The agents 402, 404, 406, 408, in one embodiment, direct commands of the appropriate type destined for a particular bank 214a to the correct queue for the bank 214a. For example, the read agent 402 may receive a read command for bank-1 214b and directs the read command to the bank-1 read queue 410b. The write agent 404 may receive a write command to write data to a location in bank-0 214a of the solid-state storage media 110 and will then send the write command to the bank-0 write queue 412a. Similarly, the erase agent 406 may receive an erase command to erase an erase block in bank-1 214b and will then pass the erase command to the bank-1 erase queue 414b. The management agent 408 typically receives management commands, status requests, and the like, such as a reset command or a request to read a configuration register of a bank 214, such as bank-0 214a. The management agent 408 sends the management command to the bank-0 management queue 416a.

The agents 402, 404, 406, 408 typically also monitor status of the queues 410, 412, 414, 416 and send status, interrupt, or other messages when the queues 410, 412, 414, 416 are full, nearly full, non-functional, etc. In one embodiment, the agents 402, 404, 406, 408 receive commands and generate corresponding sub-commands. In one embodiment, the agents 402, 404, 406, 408 receive commands through the control & status registers 340 and generate corresponding sub-commands which are forwarded to the queues 410, 412, 414, 416. One of skill in the art will recognize other functions of the agents 402, 404, 406, 408.

The queues 410, 412, 414, 416 typically receive commands and store the commands until required to be sent to the solid-state storage banks 214. In a typical embodiment, the queues 410, 412, 414, 416 are first-in, first-out ("FIFO") registers or a similar component that operates as a FIFO. In another embodiment, the queues 410, 412, 414, 416 store commands in an order that matches data, order of importance, or other criteria.

The bank controllers 418 typically receive commands from the queues 410, 412, 414, 416 and generate appropriate sub-commands. For example, the bank-0 write queue 412a may receive a command to write a page of data packets to bank-0 214a. The bank-0 controller 418a may receive the write command at an appropriate time and may generate one or more write subcommands for each data packet stored in the write buffer 320 to be written to the page in bank-0 214a. For example, bank-0 controller 418a may generate commands to validate the status of bank 0 214a and the solid-state storage array 216, select the appropriate location for writing one or more data packets, clear the input buffers within the solid-state storage memory array 216, transfer the one or more data packets to the input buffers, program the input buffers into the selected location, verify that the data was correctly programmed, and if program failures occur do one or more of interrupting the master controller 224, retrying the write to the same physical location, and retrying the write to a different physical location. Additionally, in conjunction with example write command, the storage bus controller 348 will cause the one or more commands to multiplied to each of the each of the storage I/O buses 210a-n with the logical address of the command mapped to a first physical addresses for storage I/O bus 210a, and mapped to a second physical address for storage I/O bus 210b, and so forth as further described below.

Typically, bus arbiter 420 selects from among the bank controllers 418 and pulls subcommands from output queues within the bank controllers 418 and forwards these to the Storage Bus Controller 348 in a sequence that optimizes the performance of the banks 214. In another embodiment, the bus arbiter 420 may respond to a high level interrupt and modify the normal selection criteria. In another embodiment, the master controller 224 can control the bus arbiter 420 through the control and status registers 340. One of skill in the art will recognize other means by which the bus arbiter 420 may control and interleave the sequence of commands from the bank controllers 418 to the solid-state storage media 110.

The bus arbiter 420 typically coordinates selection of appropriate commands, and corresponding data when required for the command type, from the bank controllers 418 and sends the commands and data to the storage bus controller 348. The bus arbiter 420 typically also sends commands to the storage control bus 212 to select the appropriate bank 214. For the case of flash memory or other solid-state storage media 110 with an asynchronous, bi-directional serial storage I/O bus 210, only one command (control information) or set of data can be transmitted at a time. For example, when write commands or data are being transmitted to the solid-state storage media 110 on the storage I/O bus 210, read commands, data being read, erase commands, management commands, or other status commands cannot be transmitted on the storage I/O bus 210. For example, when data is being read from the storage I/O bus 210, data cannot be written to the solid-state storage media 110.

For example, during a write operation on bank-0 the bus arbiter 420 selects the bank-0 controller 418a which may have a write command or a series of write sub-commands on the top of its queue which cause the storage bus controller 348 to execute the following sequence. The bus arbiter 420 forwards the write command to the storage bus controller 348, which sets up a write command by selecting bank-0 214a through the storage control bus 212, sending a command to clear the input buffers of the solid-state storage media 110 elements associated with the bank-0 214a, and sending a command to validate the status of the solid-state storage elements 216, 218, 220 associated with the bank-0 214a. The storage bus controller 348 then transmits a write subcommand on the storage I/O bus 210, which contains the physical addresses including the address of the logical erase block for each individual physical erase solid-stage storage element 216a-m as mapped from the logical erase block address. The storage bus controller 348 then muxes the write buffer 320 through the write sync buffer 308 to the storage I/O bus 210 through the MUX 350 and streams write data to the appropriate page. When the page is full, then storage bus controller 348 causes the solid-state storage elements 216a-m associated with the bank-0 214a to program the input buffer to the memory cells within the solid-state storage elements 216a-m. Finally, the storage bus controller 348 validates the status to ensure that page was correctly programmed.

A read operation is similar to the write example above. During a read operation, typically the bus arbiter 420, or other component of the bank interleave controller 344, receives data and corresponding status information and sends the data to the read data pipeline 108 while sending the status information on to the control and status registers 340. Typically, a read data command forwarded from bus arbiter 420 to the storage bus controller 348 will cause the MUX 350 to gate the read data on storage I/O bus 210 to the read data pipeline 108 and send status information to the appropriate control and status registers 340 through the status MUX 422.

The bus arbiter 420 coordinates the various command types and data access modes so that only an appropriate command type or corresponding data is on the bus at any given time. If the bus arbiter 420 has selected a write command, and write subcommands and corresponding data are being written to the solid-state storage media 110, the bus arbiter 420 will not allow other command types on the storage I/O bus 210. Beneficially, the bus arbiter 420 uses timing information, such as predicted command execution times, along with status information received concerning bank 214 status to coordinate execution of the various commands on the bus with the goal of minimizing or eliminating idle time of the busses.

The master controller 224 through the bus arbiter 420 typically uses expected completion times of the commands stored in the queues 410, 412, 414, 416, along with status information, so that when the subcommands associated with a command are executing on one bank 214a, other subcommands of other commands are executing on other banks 214b-n. When one command is fully executed on a bank 214a, the bus arbiter 420 directs another command to the bank 214a. The bus arbiter 420 may also coordinate commands stored in the queues 410, 412, 414, 416 with other commands that are not stored in the queues 410, 412, 414, 416.

For example, an erase command may be sent out to erase a group of erase blocks within the solid-state storage media 110. An erase command may take 10 to 1000 times more time to execute than a write or a read command or 10 to 100 times more time to execute than a program command. For N banks 214, the bank interleave controller 344 may split the erase command into N commands, each to erase a virtual erase block of a bank 214a. While bank-0 214a is executing an erase command, the bus arbiter 420 may select other commands for execution on the other banks 214b-n. The bus arbiter 420 may also work with other components, such as the storage bus controller 348, the master controller 224, etc., to coordinate command execution among the buses. Coordinating execution of commands using the bus arbiter 420, bank controllers 418, queues 410, 412, 414, 416, and agents 402, 404, 406, 408 of the bank interleave controller 344 can dramatically increase performance over other solid-state storage systems without a bank interleave function.

In one embodiment, the solid-state controller 104 includes one bank interleave controller 344 that serves all of the storage elements 216, 218, 220 of the solid-state storage media 110. In another embodiment, the solid-state controller 104 includes a bank interleave controller 344 for each row of storage elements 216a-m, 218a-m, 220a-m. For example, one bank interleave controller 344 serves one row of storage elements SSS 0.0-SSS 0.N 216a, 218a, 220a, a second bank interleave controller 344 serves a second row of storage elements SSS 1.0-SSS 1.N 216b, 218b, 220b, etc.

Storage-Specific Components

The solid-state storage controller 104 includes a synchronization buffer 346 that buffers commands and status messages sent and received from the solid-state storage media 110. The synchronization buffer 346 is located at the boundary between the solid-state storage clock domain and the local bus clock domain and provides buffering to account for the clock domain differences. The synchronization buffer 346, write synchronization buffer 308, and read synchronization buffer 328 may be independent or may act together to buffer data, commands, status messages, etc. In one embodiment, the synchronization buffer 346 is located where there are the fewest number of signals crossing the clock domains. One skilled in the art will recognize that synchronization between clock domains may be arbitrarily moved to other locations within the solid-state storage device 102 in order to optimize some aspect of design implementation.

The solid-state storage controller 104 includes a storage bus controller 348 that interprets and translates commands for data sent to and read from the solid-state storage media 110 and status messages received from the solid-state storage media 110 based on the type of solid-state storage media 110. For example, the storage bus controller 348 may have different timing requirements for different types of storage, storage with different performance characteristics, storage from different manufacturers, etc. The storage bus controller 348 also sends control commands to the storage control bus 212.

In one embodiment, the solid-state storage controller 104 includes a MUX 350 that comprises an array of multiplexers 350a-n where each multiplexer is dedicated to a row in the solid-state storage media 110 array. For example, multiplexer 350a is associated with solid-state storage elements 216a, 218a, 220a. MUX 350 routes the data from the write data pipeline 106 and commands from the storage bus controller 348 to the solid-state storage media 110 via the storage I/O bus 210 and routes data and status messages from the solid-state storage media 110 via the storage I/O bus 210 to the read data pipeline 108 and the control and status registers 340 through the storage bus controller 348, synchronization buffer 346, and bank interleave controller 344.

In one embodiment, the solid-state storage controller 104 includes a MUX 350 for each row of solid-state storage elements (e.g. SSS 0.1 216a, SSS 0.2 218a, SSS 0.N 220a). A MUX 350 combines data from the write data pipeline 106 and commands sent to the solid-state storage media 110 via the storage I/O bus 210 and separates data to be processed by the read data pipeline 108 from commands. Packets stored in the write buffer 320 are directed on busses out of the write buffer 320 through a write synchronization buffer 308 for each row of solid-state storage elements (SSS x.0 to SSS x.N 216, 218, 220) to the MUX 350 for each row of solid-state storage elements (SSS x.0 to SSS x.N 216, 218, 220). The commands and read data are received by the MUXes 350 from the storage I/O bus 210. The MUXes 350 also direct status messages to the storage bus controller 348.

The storage bus controller 348 includes a mapping module 424. The mapping module 424 maps a logical address of an erase block to one or more physical addresses of an erase block. For example, a solid-state storage media 110 with an array of twenty storage elements (e.g. SSS 0.0 to SSS M.0 216) per block 214a may have a logical address for a particular erase block mapped to twenty physical addresses of the erase block, one physical address per storage element. Because the storage elements are accessed in parallel, erase blocks at the same position in each storage element in a row of storage elements 216a, 218a, 220a will share a physical address. To select one erase block (e.g. in storage element SSS 0.0 216a) instead of all erase blocks in the row (e.g. in storage elements SSS 0.0, 0.1, . . . 0.N 216a, 218a, 220a), one bank (in this case bank-0 214a) is selected.

This logical-to-physical mapping for erase blocks is beneficial because if one erase block becomes damaged or inaccessible, the mapping can be changed to map to another erase block. This mitigates the loss of losing an entire virtual erase block when one element's erase block is faulty. The remapping module 430 changes a mapping of a logical address of an erase block to one or more physical addresses of a virtual erase block (spread over the array of storage elements). For example, virtual erase block 1 may be mapped to erase block 1 of storage element SSS 0.0 216a, to erase block 1 of storage element SSS 1.0 216b, . . . , and to storage element M.0 216m, virtual erase block 2 may be mapped to erase block 2 of storage element SSS 0.1 218a, to erase block 2 of storage element SSS 1.1 218b, . . . , and to storage element M.1 218m, etc. Alternatively, virtual erase block 1 may be mapped to one erase block from each storage element in an array such that virtual erase block 1 includes erase block 1 of storage element SSS 0.0 216a to erase block 1 of storage element SSS 1.0 216b to storage element M.0 216m, and erase block 1 of storage element SSS 0.1 218a to erase block 1 of storage element SSS 1.1 218b, . . . , and to storage element M.1 218m, for each storage element in the array up to erase block 1 of storage element M.N 220m.

If erase block 1 of a storage element SSS0.0 216a is damaged, experiencing errors due to wear, etc., or cannot be used for some reason, the remapping module 430 could change the logical-to-physical mapping for the logical address that pointed to erase block 1 of virtual erase block 1. If a spare erase block (call it erase block 221) of storage element SSS 0.0 216a is available and currently not mapped, the remapping module 430 could change the mapping of virtual erase block 1 to point to erase block 221 of storage element SSS 0.0 216a, while continuing to point to erase block 1 of storage element SSS 1.0 216b, erase block 1 of storage element SSS 2.0 (not shown) . . . , and to storage element M.0 216m. The mapping module 424 or remapping module 430 could map erase blocks in a prescribed order (virtual erase block 1 to erase block 1 of the storage elements, virtual erase block 2 to erase block 2 of the storage elements, etc.) or may map erase blocks of the storage elements 216, 218, 220 in another order based on some other criteria.

In one embodiment, the erase blocks could be grouped by access time. Grouping by access time, meaning time to execute a command, such as programming (writing) data into pages of specific erase blocks, can level command completion so that a command executed across the erase blocks of a virtual erase block is not limited by the slowest erase block. In other embodiments, the erase blocks may be grouped by wear level, health, etc. One of skill in the art will recognize other factors to consider when mapping or remapping erase blocks.

In one embodiment, the storage bus controller 348 includes a status capture module 426 that receives status messages from the solid-state storage media 110 and sends the status messages to the status MUX 422. In another embodiment, when the solid-state storage media 110 is flash memory, the storage bus controller 348 includes a NAND bus controller 428. The NAND bus controller 428 directs commands from the read and write data pipelines 106, 108 to the correct location in the solid-state storage media 110, coordinates timing of command execution based on characteristics of the flash memory, etc. If the solid-state storage media 110 is another solid-state storage type, the NAND bus controller 428 would be replaced by a bus controller specific to the storage type. One of skill in the art will recognize other functions of a NAND bus controller 428.

Data Biasing

Figure 5A:
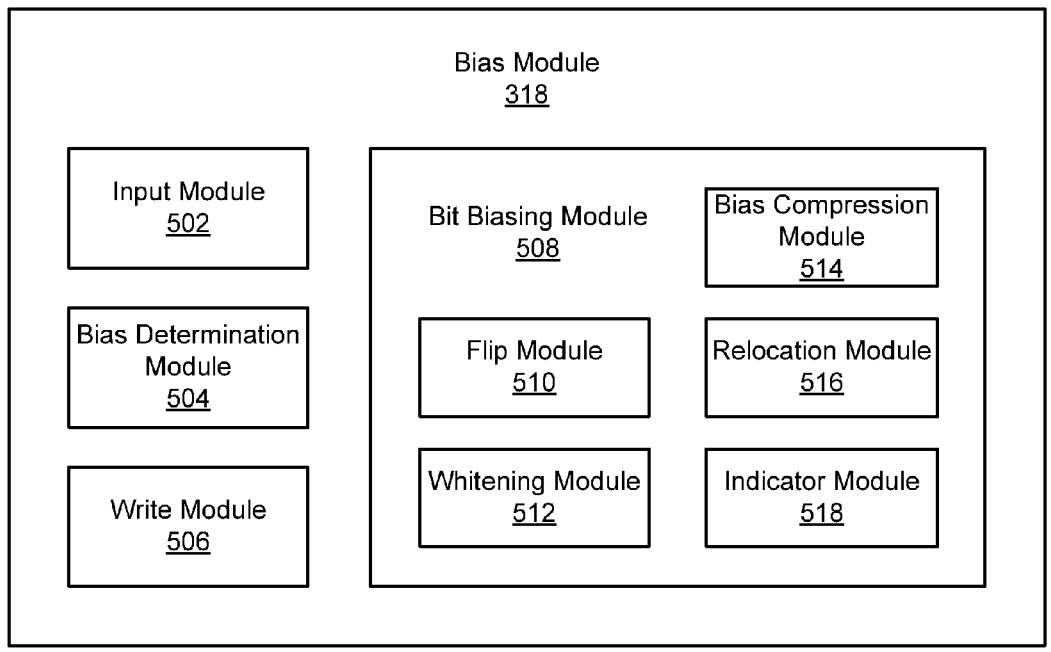
FIG. 5A is a schematic block diagram illustrating one embodiment of a bias module in accordance with the present invention.

FIG. 5A is a schematic block diagram illustrating one embodiment of the bias module 318 in accordance with the present invention. In the depicted embodiment, the bias module 318 includes an input module 502, a bias determination module 504, a write module 506, and a bit biasing module 508. In a further embodiment, one or more modules may be omitted from the bias module 318 or may be located external to the bias module 318. As described above with regard to FIG. 3, the bias module 318 receives a data packet of source data and biases bits of the data packet toward a bias of storage cells in the solid-state storage media 110.

In one embodiment, the input module 502 receives the data packet of source data to be stored in the storage cells of the solid-state storage media 110. The input module 502, in one embodiment, receives the data packet directly or indirectly from an element in the write data pipeline 106, such as the packetizer 302 or another element in the write data pipeline 106. In a further embodiment, the bias module 318 is independent of, and separate from, the write data pipeline 106, and the input module 502 may receive the data packet from a different bus, buffer, module, or the like for storage in the storage cells of a non-volatile solid-state storage media, such as the solid-state storage media 110.

In one embodiment, the bias determination module 504 determines that a source bias of the data packet that the input module 502 receives is different from a bias of the storage cells. As described above with regard to the bias module 318 of FIG. 3, a bias is a preference, probability, or tendency of values for bits within a set of bits to exhibit a specific data pattern, such as toward binary ones, toward binary zeroes, toward a balance of binary ones and zeroes, toward a certain binary value of several bits, or the like. The bias determination module 504 may make a determination for the entire data packet, or for subsets of the data packet.

The bias determination module 504, in one embodiment, determines the number of bits of each binary value within the data packet. The bias determination module 504 may determine that the source bias is different than the bias of the storage cells using one or more predefined thresholds or ranges of biases. The thresholds or ranges may be selected based on a type of biasing performed by the bit biasing module 508, as discussed below. For example, in one embodiment, the bias determination module 504 may determine that the source bias of the data packet is different from the bias of the storage cells in response to more than fifty percent of the bits of the data packet differing from the bias of the storage cells.

In one embodiment, the bit biasing module 508 biases the bits of the data packet that the input module 502 receives toward the bias of the storage cells. To bias the data packet, the bit biasing module 508 may bias the bits of the entire data packet, or of one or more subsets of the data packet. For example, the bit biasing module 508, in various embodiments, may bias both header data (or other metadata) and user data within the data packet, may just bias user data, may bias selected chunks of the data packet, or the like.

The bit biasing module 508, in one embodiment, biases the bits of the data packet in response to the bias determination module 504 determining that the source bias of the data packet is different from the bias of the storage cells. In a further embodiment, the bit biasing module 508 biases the bits of each data packet, regardless of a source bias of the data packet. In yet another embodiment, the bit biasing module 508 biases the bits of each data packet, based on an expected or anticipated source bias of the data packet.

In the depicted embodiment, the bit biasing module 508 includes a flip module 510, a whitening module 512, a bias compression module 514, a relocation module 516, and an indicator module 518. The bit biasing module 508, in one embodiment, uses one or more of the flip module 510, the whitening module 512, and the bias compression module 514 to bias the bits of the data packet toward the bias of the storage cells.

In one embodiment, the flip module 510 flips binary values of the bits of the data packet to satisfy the bias of the storage cells. It should be noted that while groups of data are referenced herein using the term "data packet," those of skill in the art recognize that a data packet is a collection of data not limited to a particular physical construct such as a data bus width, physical storage page size or the like. The term "data packet" as used herein refers to any collection of data whether determined by a physical architecture or determined by a logical data structure construct. Consequently, references to data packet may be suitably replaced with ECC chunk, logical page, logical erase block, and the like. As used herein, the term flipping a bit means inverting the binary value of the bit. The flip module 510, in one embodiment, flips the binary values in response to the determination by the bias determination module 504 that the source bias of the data packet is different than the bias of the storage cells.

For example, if the bias of the storage cells is toward binary ones, in one embodiment, the flip module 510 may flip the values of the bits of the data packet in response to the data packet being biased toward binary zeroes, meaning the source data packet has fewer than fifty percent binary ones. By flipping the bits of data packets that are biased toward binary zeroes, the flip module 510 forms a resulting biased data packet that is biased toward binary ones, having more than fifty percent binary ones. In one embodiment, the size of the data packet is known, therefore the flip module 510 readily determines when the number of bits with binary zeros exceeds fifty percent. In this manner, even if the distribution of data packets having a bias toward binary one and a bias toward binary zero is a normal distribution (bell curve), the flip module 510 effectively folds the half of the bell curve for data packets having a bias toward binary zero on top of the half of the bell curve for data packets having a bias toward binary one. The net effect is that the flipped data packet becomes more biased towards ones. In another embodiment, the flip module 510 flips data packets to bias them toward binary zeroes. In a further embodiment, for example when a majority of data packets have a source bias that is different than the bias of the storage cells, the flip module 510 may flip each data packet regardless of the source bias of the data packet.

In one embodiment, the benefits of flipping a set of data (i.e. data packet, code word, ECC chunk, logical page, logical erase block, or the like) vary with the size of the data packet, and the data packet may be sized to balance benefits provided by the flip module 510 with the overhead of storing an indicator that a flip has been made to the set of data. In certain embodiments, the overhead of storing an indicator that the bias module 318 has performed a transformation on a set of data can be overcome by using previously reserved or unused bits in a header or other set of metadata stored on the solid state storage media 110. For example in one embodiment, the ECC checkbits and other ECC code information uses all but n bits of an m bit data packet that stores the ECC check bits and ECC code information. For example suppose the ECC information is stored in a sixty four bit data packet (the "ECC packet") and seven bits are unused. One of these seven bits can be used to indicate whether all the bits of an ECC chunk associated with the ECC packet have been flipped. Alternatively, each of these seven bits can be used to represent whether any one of seven subsets of all the bits of an ECC chunk associated with the ECC packet have been flipped.

In certain embodiments, the size of the data packet is set such that flipping bit values by the flip module 510 yields a benefit a majority of the time. In this manner, there is no need to store an indicator of whether or not a bit flip has occurred because each data packet may be flipped by the bit biasing module 508 and unflipped by the inverse biasing module 332. The benefit of reducing wear on the storage cells may outweigh the overhead of flipping and un-flipping the bits, particularly where the storage cells are heavily biased to one binary value or the other.

In a further embodiment, the flip module 510 may flip subsets of the data packet individually, and the subsets may be sized to balance the benefits of flipping with the overhead of storing an indicator. For example, if the data packet (or data packet subset) is small, the benefits gained by flipping the bits may not outweigh the overhead of storing and tracking an indicator to indicate to the inverse bias module 332 that the bits have been flipped. Conversely, if the data packet is large, although the overhead of storing an indicator is minimized, flipping may have a smaller benefit, because the bits of a large data packet may more likely be balanced between binary ones and zeroes. In another embodiment, the data packet (or data packet subsets) may be sized based on a size of a storage region in the solid-state storage media 110, a size of a bus or buffer, a number of extra bits available for storage of an indicator, or the like.

In one embodiment, the whitening module 512 pseudo-randomizes the values of the bits of the data packet. As used herein, the terms "whiten," "whitening," and "whitened" refer to a transformation of binary data values in a given set of data that shifts the bias of binary one or zeros toward an opposite bias. In certain situations, the bias shift caused by whitening comprises changing a distribution of binary ones and binary zeros to a more even distribution. The whitening module 512 pseudo-randomizes the values of the bits in a reversible manner, such that the inverse bias module 332 may convert the bits of the biased data packet back to its original source data state. The whitening module 512, in various embodiments, may use encryption, scrambling, or other randomization methods to pseudo-randomize the values of the bits of the data packet.

The whitening module 512, in a further embodiment, may pad source data, such as a data packet, with padding data that biases the source data toward a certain bias. For example, to bias a data packet toward binary ones, the whitening module 512 may pad source data with binary ones. By adding extra padding data to source data, in certain embodiments, the whitening module 512 can achieve a target bias exactly, such as an exact equal number of binary ones and binary zeroes, or the like. In other embodiments, it may be undesirable to exactly match a bias.

In embodiments where the whitening module 512 pads source data, the whitening module 512 may add the padding data in a single location within the source data, interleave or spread the padding data reversibly through the source data, or otherwise add the padding data to the source data to bias the source data. In certain embodiments, padding source data expands or inflates a size of the source data. In other embodiments, as described below with regard to the bias compression module 514, compressing source data and adding padding data in the amount of space gained by compression biases the source data without increasing the size of the source data.

In one embodiment, the whitening module 512 uses encryption to pseudo-randomize the data packet. Encryption may, in one embodiment, bias the data packet toward a balance of binary ones and zeroes. In one embodiment, the whitening module 512 is substantially similar to the encryption module 314 described above with regard to FIG. 3 and may replace or be part of the encryption module 314. For example, the encryption module 314 may use an encryption routine that pseudo-randomizes the data in addition to or as part of encrypting the data.

In one embodiment, the whitening module 512 pseudo-randomizes the data packet by XORing a pseudorandom binary sequence or other deterministic pattern with the data packet. In a further embodiment, the whitening module 512 pseudo-randomizes the data packet using a galois-style Linear Feedback Shift Register ("LFSR"). In one embodiment, the pseudorandom binary sequence or other deterministic pattern is determinable by both the whitening module 512 and the inverse bias module 332 without storing additional data.

In one embodiment, the whitening module 512 pseudo-randomizes each data packet that will be stored on the solid-state storage media 110 using a single seed value for the LFSR. Alternatively or in addition, in another embodiment, the whitening module 512 pseudo-randomizes each data packet that will be stored in a particular logical erase block of the solid-state storage media 110 using a single seed value for the LFSR. A new seed value may be used for a subsequent logical erase block. Alternatively or in addition, in yet another embodiment, the whitening module 512 pseudo-randomizes each data packet that will be stored in a particular logical page of the solid-state storage media 110 using a single seed value for the LFSR. A new seed value may be used for a subsequent logical page. Alternatively or in addition, in yet another embodiment, the whitening module 512 pseudo-randomizes each data packet that will be stored in a particular ECC chunk on the solid-state storage media 110 using a single seed value for the LFSR. A new seed value may be used for a subsequent ECC chunk.

A seed value for generating the pseudorandom binary sequence may be used that is known or already accessible to both the whitening module 512 and the inverse bias module 332. The seed value may be determined using one or more known items such as addresses, sequence numbers, dates, times, or other data that is known or already stored together with or separate from the data packet and accessible to the whitening module 512 and the inverse bias module 332.

In one embodiment, the one or more known items may be entered into a hash function to generate the seed value, and the seed value may be entered into a pseudorandom number generator to generate the pseudorandom binary sequence. This allows both the whitening module 512 and the inverse bias module 332 to access or generate the pseudorandom binary sequence or other deterministic pattern without the overhead of storing additional data.

In a further embodiment, the whitening module 512 may use a sequence number or address of a logical erase block or other storage region of the solid-state storage media 110 that is associated with the data packet as a seed value. For example, in one embodiment, the solid-state storage controller 104 may store a sequence number or other seed value in a physical page of a solid state storage element in response to erasing the logical erase block. Alternatively, or in addition, in one embodiment, the solid-state storage controller 104 may store a sequence number or other seed value in a physical page of a solid state storage element in response to formatting, partitioning, or otherwise preparing the solid-state storage media 110 for use. The sequence number or other seed value is accessible to both the whitening module 512 and the inverse bias module 332, and provides a convenient seed value without additional storage.

The sequence number or other seed value, in certain embodiments, may be associated with a particular region of the solid-state storage media 110, such as a code word, data packet, data stripe, ECC chunk, physical page, logical page, physical erase block, logical erase block, or the like. In one embodiment, this association is represented by storing the sequence number or other seed value within a predefined location in the region. For example, where the region is a logical erase block, a predefined location may include a physical page of a physical erase block that is within the logical erase block, or the like. The sequence number, in a further embodiment, is a preset sequence number stored in the predefined location during an erase procedure, such as a garbage collection procedure, a grooming procedure, or the like. Each logical erase block or other region associated with a sequence number, in one embodiment, receives a new or updated sequence number in response to each erase procedure. Changing the sequence number each erase procedure, in certain embodiments, may enhance wear leveling and pseudo-randomization of data in a logical erase block or other region. In another embodiment, this association between a sequence number and a particular logical erase block is represented by an index or other metadata associating the sequence number or other seed value with the logical erase block.

In one embodiment, where a sequence number is used to manage a particular set of data (such as a code word, data packet, data stripe, ECC chunk, physical page, logical page, physical erase block, and logical erase block) on the solid-state storage media 110, further steps are taken to ensure that the binary values that represent the sequence number on the storage media is biased more towards a bias of storage cells of the media in an empty state. As used herein, "empty state" refers to the state of a storage cells prior to any data being written to the storage cell. In certain embodiments, an empty state may also include the state of a storage cell once the storage cell is erased. A field used to store the sequence number as binary values may have a fixed size (i.e. a fixed width). As sequence numbers are stored in the field, the field itself may exhibit a bias of fifty percent or higher towards all binary ones or binary zeros as the generated sequence numbers are used because the numbers are generated from an ordered sequence.

Therefore in certain embodiments, the binary data values that represent the sequence number are whitened to shift the bias of binary data values toward a bias that decreases wear on the storage cells over the life of the storage cells. For example, if the sequence number is biased towards binary zeros, shifting the bias toward even a balance of binary ones and binary zeros will result in decreased wear on the storage cells over the life of the storage cells.

The storage controller 104 and/or read module 550 seeks to determine whether a data packet read includes a valid header. If a patterned header is used, the read module 550 would detect the presence of the pattern. However, storing a regular patterned header on the storage cells can increase wear on the cells. Therefore, in order to verify that a data packet is a valid header and avoid introducing patterned wear on the storage cells through a patterned header, the present invention biases the header data values such that each storage cell receives a balanced number of binary ones and binary zeros. In certain embodiment, the bias imposed on the header data values is such that the biased header more closely reflects a bias of the binary values of the storage cells.

In one embodiment, a particular set of data read from the solid-state storage media 110, such as an erase block includes a header. The header comprises at least two fields. The first field may store a pseudorandom or random number that serves as a sequence number or seed that may be used by the bias module 318 and inverse bias module to bias and unbias sets of data (i.e. data packets). The second field may store a constant, predefined value in a transformed binary form, referred to herein as a magic number. The magic number is known to the bias module 318 and the inverse bias module 332. Those of skill in the art recognize that a magic number may be a constant value (numerical or text) chosen by a software developer to provide a reference number that can be used for different purposes such as identifying a file format or protocol and/or to determine that data integrity has been preserved throughout a transformation or storage operation.

In a certain embodiment, the SSS controller 104 stores the pseudorandom or random number in the first field and transformed magic number in the second field on the storage media. In one embodiment, the bit biasing module 508 biases the pseudorandom or random number and transformed magic number using one or more of the flip module 510, the whitening module 512, and the relocation module 516. In one embodiment, the transformed magic number is transformed by the whitening module 512 of the bit biasing module 508. The seed used by the whitening module 512 is the pseudo-random or random number in the first field. As a result, the whitening module 512 biases the magic number is whitened before being stored such that wear on the storage media is minimized.

In addition, the inverse bit biasing module 552 may be used to verify that the first field and second field represent a valid header field. In one embodiment, the whitening module 512 performs an eXclusive OR (XOR) operation using the magic number and the pseudorandom or random number of the first field as inputs. The result is a transformed magic number that is stored in the second field. Alternatively, one or more other modules of the bias module 318 may bias the magic number and or the pseudorandom or random number. Once the first and second fields are read, the inverse bit biasing module 552 XORs the transformed magic number and the pseudorandom or random number of the first field. If the result is the magic number, and no ECC errors have been signaled, then the header is valid. In addition, if the result is the magic number, and no ECC errors have been signaled, then the second field, the magic number, is known to have been biased by the bias module 318. Conversely, if the result is not the magic number, and no ECC errors have been signaled, then the second field, the magic number, is known to have not been biased by the bias module 318. Detecting that a header field has been biased by the solid-state controller 104 is advantageous in determining whether the contents of the data structure the header identifies has been biased.

Assigning a sequence number or other seed value as part of an erase procedure has the added benefit of tracking which logical erase blocks have been used by the solid-state storage controller 104. Unused, new logical erase blocks have no stored sequence number or other seed value, differentiating unused logical erase blocks from previously used logical erase blocks. In one embodiment, the sequence number or other seed value may be used by the encryption module 314 for media encryption, or may be otherwise used by the solid-state storage controller 104 for another purpose. As described above, in certain embodiments, the solid-state storage controller 104 changes or updates the sequence number for a logical erase block each erase procedure, further enhancing wear leveling, encryption, and/or other uses of the sequence number for biasing purposes.

In one embodiment, for example, the solid-state storage controller 104 may store a seed value in a beginning portion of each logical erase block that the solid-state storage controller 104 erases, in the first sixty-four bits, one hundred and twenty-eight bits, or the like. If the seed value is not stored in a logical erase block, the solid-state storage controller 104 can detect that a particular logical erase block has not been previously used (in other words the logical erase block is in the same state as when originally shipped from the manufacturer). The whitening module 512, in one embodiment, uses the sequence number or other seed value from a logical erase block to pseudo-randomize the bits of one or more data packets for storage in the logical erase block. As described above, the whitening module 512 may enter the sequence number or other seed value into a pseudorandom number generator or the like to generate a pseudorandom binary sequence.

Detecting what data structures have, and what data structures have not, been biased by the solid-state controller 104 may be useful in testing to determine how effective different bit biasing operations of the bit biasing module 508 are in reducing wear of storage cells of the storage media. Furthermore, detecting what groupings of data (packets, pages, erase blocks, die, etc.) on the storage media have been biased, and what groupings of data on the storage media have not been biased may be used to distinguish between storage cells that have been used to store data for the solid-state storage controller 104 (See FIG. 1) (referred to herein as "active storage cells") and storage cells that have not been previously used (in other words the storage cells are in the same state as when originally shipped from the manufacturer) (referred to herein as "original-state storage cells"). In certain embodiments, the bit biasing module 508 may intentionally leave certain regions of the solid-state storage media 110 unbiased, such as system tracks, boot data, recovery data, or the like, so that the regions may be accessed without inverse biasing by the inverse bias module 332, or the like.

Distinguishing between active storage cells which may have some form of biasing imposed by the storage controller 104 and original-state storage cells provides contextual information for other functions of the solid-state storage device 102. For example, the solid-state storage device 102 may use the context information when sequentially reading the stored data to reconstruct data or metadata indexes and other metadata based on data packet headers. The context information distinguishes active storage cells from original-state storage cells such that no end-of-file, or other indicator needs to be stored on the storage media.

In certain embodiments, in order to detect whether a bias has been imposed on active storage cells, the bias module 318 applies the bias to groupings of storage cells such as packets, ECC chunks, pages, erase blocks, and/or die. In addition or alternatively, the bias module 318 may apply a bias to one or more of headers, footers, or other metadata fields and not to all the data in a grouping. For example, as discussed above erased storage cells can be distinguished from original-state storage cells if the erase process includes biasing of, in one example, at least a header for the erase block. Original-state storage cells in such an embodiment would not have a biased header in the erase block.

In addition, in embodiments that distinguish between active storage cells and original-state storage cells, the bias module 318 is configured to not change the bias for data packets or other data structures for which the bias of the data structure exactly matches the bias of original-state storage cells. For example, if the original-state storage cells original state is a binary one, the bias module 318 may not impose any change in bias on a data packet having all binary ones. This feature coupled with a deterministic changing of bias for data packets having a bias different from the bias of the media storage cells enables the distinguishing of active storage cells from original-state storage cells.

Re-Arrangement

In one embodiment, the whitening module 512 pseudo-randomizes the bits of the data packet by rearranging them. While pseudo-randomizing the bits of the data packet using encryption (or Xoring the data packet with a pseudorandom binary sequence, also known as scrambling) changes the values of actual data bits stored in the data packet, pseudo-randomizing the bits of the data packet by rearranging them does not. Rearranging can bias a data packet by ensuring that each subset of the data packet is biased toward the bias of the storage cells. For example, while rearranging a data packet will not change the amount of binary ones or binary zeroes that are in the data packet, it may more evenly distribute them within the data packet. If the storage cells are biased toward a balance of binary ones and zeroes, for example, and the data packet has mostly binary ones at the beginning of the data packet, and mostly binary zeroes at the end of the data packet, rearranging the data packet will bias the data packet toward the bias of the storage cells. The whitening module 512 rearranges the bits of a data packet according to a reversible algorithm so that the inverse bias module 332 can place the bits of the data packet in their original source order by reversing the rearranging.

In one embodiment, the whitening module 512 rearranges the bits of the data packet in conjunction with one or more of the flip module 510, the bias compression module 514, and the relocation module 516. Rearranging the data packet, in one embodiment, may have additional benefits for the solid-state storage media 110 beyond satisfying a bias of the storage cells. For example, if consecutive data packets have repetitive patterns of data bits, pseudo-randomly rearranging the bits of the data packets prevents inconsistent wear in the storage cells. Without rearranging or other pseudo-randomization by the whitening module 512 (or shifting by the relocation module 516), certain bit positions in a header that consistently have the same binary value or other repeated patterns of data in consecutive data packets can wear out storage cells corresponding to those bit positions.

As described above with regard to randomization of bits (encryption in certain embodiments) by the whitening module 512, in one embodiment, the whitening module 512 rearranges the bits of the data packet deterministically, such that the inverse bias module 332 can convert the bits of the data packet to their original source order without using extra stored information. For example, the whitening module 512 may use one or more known values to pseudo-randomize the order of bits in the data packet, so that the inverse bias module 332 may use the same known values to convert the bits in the data packet to their original source order.

In one embodiment, the relocation module 516 rearranges the bytes within a physical page on the solid state storage media 110 by pseudo-randomizing the order in which the bytes for the physical page are selected from a buffer, such as the write buffer 320, the write synchronization buffer 308, or the like. The whitening module 512 may utilize preexisting multiplexing ("MUXing") capabilities of the buffer. The pseudo-randomized selection order is both detectable and reversible by the inverse bias module 332. The inverse bias module 332 determines a reverse selection order and orders placement of bytes from a read physical page into a read buffer such as read sync. buffer 328. In this manner the data read from the read sync. buffer is in the same order as the data was originally in the output or write buffer 320. Those of skill in the art will recognize that this same rearrangement technique can be used for selecting packets for removal from the output buffer 320 and for placement into the read sync. buffer 328.

In one embodiment, the whitening module 512 rearranges the bits of the data packet by pseudo-randomizing the order in which the bits of the data packet are removed from a buffer, such as the write buffer 320, the write synchronization buffer 308, or the like. This randomizes the order of subsets of data within the data packet that are the size of the data path from the buffer, and may utilize preexisting multiplexing ("MUXing") capabilities of the buffer.

Advantageously, rearrangement of the bits, bytes, packets, and/or ECC chunks that are written to the solid state storage media 110 serves to randomly distribute metadata within the written data structure that is often biased with a certain pattern of binary values. In addition, this metadata is often very patterned in the positioning of metadata such as headers, addresses, and other information. By rearranging the positioning of this metadata in a manner that is reversible, the wear on solid state storage media 110, such as NAND flash, can be more evenly distributed.

In a further embodiment, the whitening module 512 performs one or more additional stages of rearrangement within each subset of data. For example, in an embodiment with data packets larger than sixty-four bits and a data path of sixty-four bits from a buffer, initially the whitening module 512 may scramble the order of sixty-four bit subsets of the data packet, and in a second stage the whitening module 512 may scramble the eight bytes within each sixty-four bit subset. In a further embodiment, the whitening module 512 may scramble the eight bits within each byte of a subset during a third stage. The inverse bias module 332, in one embodiment, uses one or more known values or stored indicators to reverse this process and rearrange the data packet in its original source order.

In one embodiment, the bias compression module 514 compresses the data packet to gain an amount of space. The bias compression module 514, in a further embodiment, pads the amount of space gained by the compression with bits of data that bias the data packet toward the bias of the storage cells. The bias compression module 514 may compress the data packet in a similar manner to the compression module 312. In one embodiment, the bias compression module 514 replaces or is part of the compression module 312 and may alter a compression routine to bias data. In one embodiment, the bias compression module 514 may differ from the compression module 312 in that the purpose of the compression by the bias compression module 514 is not to maximize the amount of data that may be stored in the solid-state storage media 110, but to bias the data toward the bias of the storage cells. The data packet that the bias compression module 514 compresses, in one embodiment, has been packetized by the packetizer 302 and is sized for storage in a specific storage region of the solid-state storage media 110 such that space gained by compressing the data packet may not be usable by other data packets.

In one embodiment, the bias compression module 514 biases the data packet by padding the space gained by the compression. For example, the bias compression module 514, in one embodiment, may fill the space gained by the compression with binary ones, binary zeroes, a balance of binary ones and zeroes, or another data pattern that more closely satisfies the bias of the storage cells. In a certain embodiment, the bias compression module 514 may select padding data that causes the data packet or other source data to exactly match a target bias, such as an exact balance of binary ones and binary zeroes, or the like. In other embodiments, it may be undesirable to exactly match a target bias. The bias compression module 514 may pad source data by adding the padding data in a single location within the source data, interleaving or spreading the padding data reversibly through the source data, or otherwise adding the padding data to the source data to bias the source data. As described above, in certain embodiments, the whitening module 512 may pad source data without compressing the source data.

In a further embodiment, the bias compression module 514 pads the space gained by the compression with useful data that biases the data packet toward the bias of the storage cells. For example, in one embodiment, the bias compression module 514 may store bias indicators from the indicator module 518 in the space gained that identify how the bit biasing module 508 has biased the data packet such that the inverse bias module 332 can reverse the operation. In another example, in one embodiment, the bias compression module 514 may store ECC code data in the gained space, in conjunction with or in addition to the ECC data generated by the ECC generator 304. This may provide more robust error correction than would be available without the compression using ECC data from the ECC generator 304 alone.

In one embodiment, the relocation module 516 shifts the bits of the data packet within the data packet such that a start position for data and metadata within the data packet changes for each data packet. Shifting bits, in various embodiments, may include relocating the bits, interleaving the bits, rearranging the bits, rotating positions of the bits, or the like. The relocation module 516 shifts the bits according to a reversible algorithm such that the inverse bias module 332 may recover the source data in an original source state. In one embodiment, the relocation module 516 shifts the bits in conjunction with one or more of the flip module 510, the whitening module 512, and the bias compression module 514.

In one embodiment, the relocation module 516 selects a location within the data packet and/or within a storage region of the solid-state storage media 110 for the start position. The relocation module 516 may shift the bits of the data packet within a buffer or other temporary storage, or may cooperate with the write module 506 to write the data packet to the storage region of the solid-state storage media 110 in a shifted order. In one embodiment, the relocation module 516 starts the data and metadata at the starting location and continues the data and metadata to an end of the data packet and/or storage region, wrapping the data and metadata around to a beginning of the data packet and/or storage region.

The relocation module 516, in one embodiment, uses a reversible algorithm to select the starting position such that the inverse bias module 332 may re-shift the bits of the data packet to their original source positions. For example, the relocation module 516, in one embodiment, may derive the starting location from one or more sequence numbers, addresses, or the like. The relocation module 516, in certain embodiments, may pseudo-randomly select a starting location, a shifted order, or the like. In another embodiment, the relocation module 516 may use a fixed offset for the starting location for each data packet throughout the solid-state storage media 110, and may change the offset periodically over time, or the like. The relocation module 516, in one embodiment, may initially use a starting position that is at a beginning of the data packet and/or storage region, and may shift the starting position by a predefined amount, such as one bit, with each successive data packet for the storage region.

In a further embodiment, an indicator, such as an end-of-file ("EOF") symbol or other bit pattern, allows the inverse bias module 332 to locate the starting location. Like the rearranging by the whitening module 512, the shifting by the relocation module 516 reduces wear on storage cells that correspond to locations within the data packet that repeatedly have a bias different than the bias of the storage cells, balancing the wear throughout the storage region. In certain embodiments, the relocation module 516 may reduce inter-cell interference, improve a signal to noise ratio, or the like. In one embodiment, the relocation module 516 may shift bits of source data in conjunction with biasing of the source data by the flip module 510, the whitening module 512, and/or the bias compression module 514. In other embodiments, the relocation module 516 may operate independently, shifting bits of the source data without additional biasing from other modules.

In one embodiment, the indicator module 518 stores an indicator for the data packet to indicate to the inverse bias module 332 that the bias module 318 has biased the bits of the data packet. The indicator module 518 may store the indicator as metadata with the data packet, with other metadata elsewhere in the solid-state storage media 110, or in other storage separate from the solid-state storage media 110. For example, in one embodiment, the indicator module 518 may store the indicator with ECC data from the ECC generator 304. For example, the indicator module 518 may store a bit or other indicator for each data packet or subset of a data packet, indicating whether the flip module 510 has flipped it. In a further embodiment, the indicator module 518 may store an indicator to indicate an offset or starting location used by the relocation module 516.

As described above, in one embodiment, the bit biasing module 508 uses known data as a seed, nonce, offset, or the like such that the indicator module 518 is not needed. In another embodiment, the indicator module 518 may store a seed, nonce, offset value, or the like to assist the inverse bias module 332 in converting the biased data packet back to its original source state. In one embodiment, the bit biasing module 508 uses one or more of the flip module 510, the whitening module 512, the bias compression module 514, and the relocation module 516 to bias, whiten, scramble, rearrange, or relocate bits of data stored by the indicator module 518 to minimize wear on the storage cells that may be caused by the indicator data.

The bit biasing module 508, in one embodiment, determines which of the flip module 510, the whitening module 512, the bias compression module 514, and the relocation module 516 to use, and which biasing, whitening, scrambling, rearranging, or relocating techniques to employ based on configurable parameters. The configurable parameters may be set by a user, an operating system, a file system, a device driver, a volume manager, or the like. The configurable parameters may be universally applicable to each data packet, or may be apply to a subset of data packets.

In one embodiment, the write module 506 writes the biased data packet to the storage cells of the solid-state storage media 110, either directly or indirectly. For example, in one embodiment, the write module 506 may write the biased data packet to an element in the write data pipeline 106, such as the ECC generator 304, the write buffer 320, or the like. In a further embodiment, the write module 506 may include, may write to, or may be in communication with the write agent 404 or the like to write the biased data packet to the storage cells of the solid-state storage media 110. The write module 506, in one embodiment, writes the biased data packet to a specific storage region of the solid-state storage media 110.

Figure 5B:
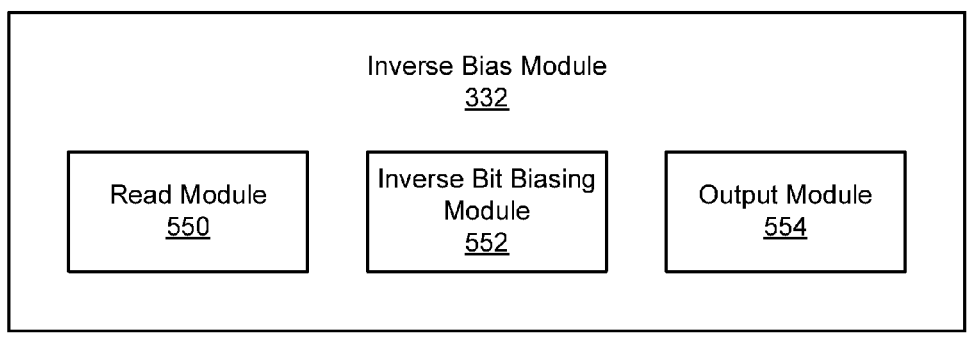
FIG. 5B is a schematic block diagram illustrating one embodiment of an inverse biasing module in accordance with the present invention.

FIG. 5B is a schematic block diagram illustrating one embodiment of the inverse bias module 332 in accordance with the present invention. In the depicted embodiment, the inverse bias module 332 includes a read module 550, an inverse bit biasing module 552, and an output module 554. In general, the inverse bias module 332 reads the biased data packet from the storage cells of the solid-state storage media 110 and converts the bits of the biased data packet back to bit values representative of the source data of the data packet, including a source bias of the data packet.

In one embodiment, the read module 550 reads the biased data packet, either directly or indirectly from the storage cells. For example, in one embodiment, the read module 550 may read or otherwise receive the biased data packet from an element in the read data pipeline 108, such as the ECC correction module 322, the read synchronization buffer 328, or the like. In another embodiment, the read module 550 may include, may read from, or may otherwise be in communication with the read agent 402 or the like to read the biased data packet from the storage cells of the solid-state storage media 110.

In one embodiment, the inverse bit biasing module 552 converts the bits of the biased data packet back to the original source data of the data packet. The inverse bit biasing module 552 may access an indicator or other information stored by the indicator module 518, or may use a known seed, nonce, offset, or the like to convert the biased data packet back to the original source data packet.

In one embodiment, the inverse bit biasing module 552 flips binary values of bits of the biased data packet to undo flipping by the flip module 510. In a further embodiment, the inverse bit biasing module 552 uses a known or stored seed, nonce, or the like to undo encryption, scrambling, or other pseudo-randomization of the data packet by the whitening module 512. The inverse bit biasing module 552, in another embodiment, decompresses the biased data packet that the bias compression module 514 compressed. In a further embodiment, the inverse bit biasing module 552 shifts the bits of the biased data package to undo the shifting of the bits by the relocation module 516.

In one embodiment, the output module 554 sends the data packet of source data from the inverse bit biasing module 552 to a module, buffer, the computer 112, a client 114, or the like. In a further embodiment, the output module 554 sends the data packet to an element in the read data pipeline 108, such as the depacketizer 324, the ECC correction module 322, or the like.

Figure 6A:
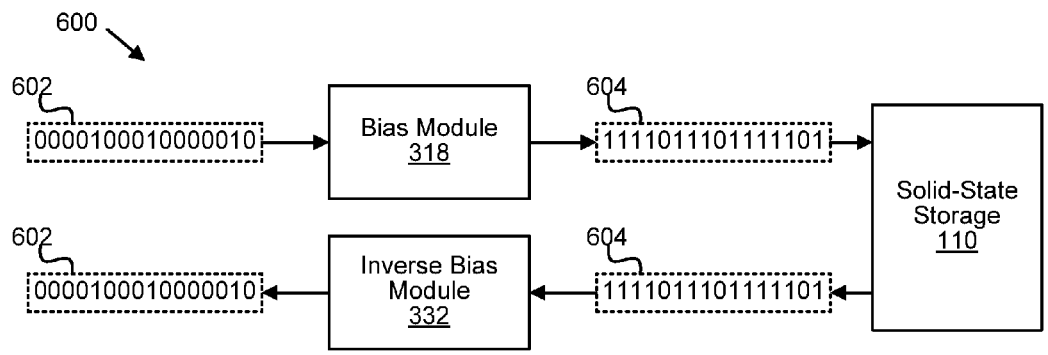
FIG. 6A is a schematic block diagram illustrating one embodiment of a system for improving performance in a solid-state storage device in accordance with the present invention.

FIG. 6A is a schematic block diagram illustrating one embodiment of a system 600 for improving performance in a solid-state storage device in accordance with the present invention. In the depicted embodiment, storage cells of the solid-state storage media 110 have a bias toward binary ones and a source data packet 602 is biased toward binary zeroes. The source data packet 602 has thirteen binary zeroes and three binary ones.

In the depicted embodiment, the bias module 318 uses the flip module 510 to flip the binary values of the bits of the source data packet 602 to form a biased data packet 604. The biased data packet 604 is biased toward the bias of the solid-state storage media 110, having thirteen binary ones and three binary zeroes. In a further embodiment, the bias module 318 may use one or more of the whitening module 512, the bias compression module 514, and/or the relocation module 516 to convert the source data packet 602 to the biased data packet 604. In one embodiment, the bias module 318 uses the indicator module 518 to store an indicator to indicate that the bias module 318 biased the bits of the source data packet 602 to form the biased data packet 604. The solid-state storage media 110 stores the biased data packet 604 in the storage cells of a storage region.

In one embodiment, storage cells of the solid-state storage media 110 each store an initial binary value in preparation for storing the biased data packet 604. In the depicted embodiment, the storage cells each store a binary one. To store the biased data packet 604, the solid-state storage media 110 changes the value of the three storage cells corresponding to the binary zeroes. To store the source data packet 602, the solid-state storage media 110 would have to change the values in thirteen storage cells. By biasing the source data packet 602 toward the bias of the storage cells of the solid-state storage media 110, the bias module 318 reduces the number of storage cells that are changed from their biased values to store the data from the source data packet 602.

The inverse bias module 332 reads the biased data packet 604 from the solid-state storage media 110 using the read module 550. The inverse bias module 332 uses the inverse bit biasing module 552 to convert the bits of the biased data packet 604 back to the source data of the source data packet 602, with the source bias of the source data packet 602.

Figure 6B:
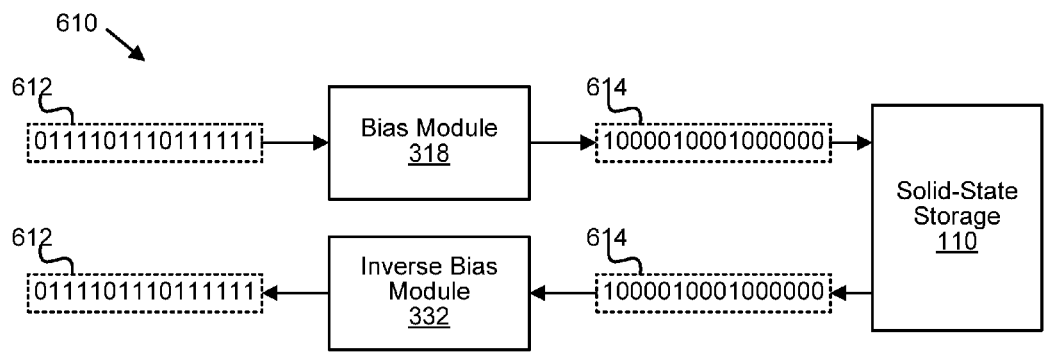
FIG. 6B is a schematic block diagram illustrating another embodiment of a system for improving performance in a solid-state storage device in accordance with the present invention.

FIG. 6B is a schematic block diagram illustrating one embodiment of a system 610 for improving performance in a solid-state storage device in accordance with the present invention. In one embodiment, the system 610 is substantially similar to the system 600 of FIG. 6A, but the solid-state storage media 110 of the system 610 is biased toward binary zeroes. The bias module 318 biases a source data packet 612 from a bias toward binary ones to a biased data packet 614 with a bias toward binary zeroes, for storage in the solid-state storage media 110. In the depicted embodiment, the bias module 318 uses the flip module 510 to bias the source data packet 612 to the biased data packet 614. Similarly, the inverse bias module 332 uses the inverse bit biasing module 552 to flip the bits of the biased data packet 614 to convert the biased data packet 614 back to the source data packet 612.

Figure 6C:
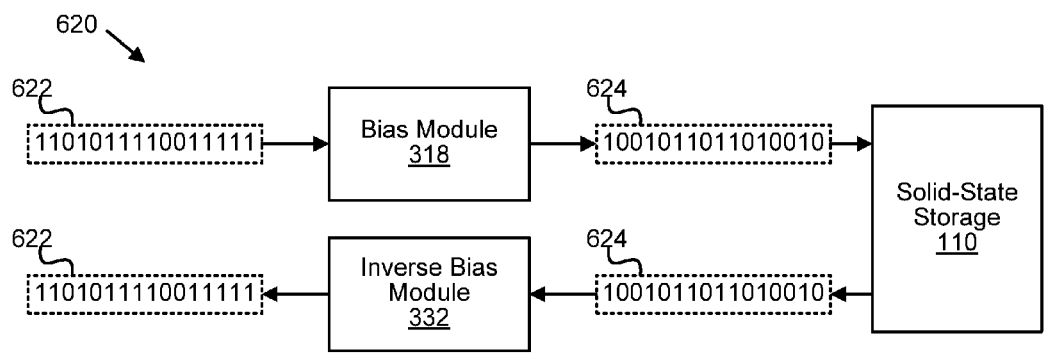
FIG. 6C is a schematic block diagram illustrating an additional embodiment of a system for improving performance in a solid-state storage device in accordance with the present invention.

FIG. 6C is a schematic block diagram illustrating one embodiment of a system 620 for improving performance in a solid-state storage device in accordance with the present invention. In the depicted embodiment, a source data packet 622 is biased toward binary ones and the solid-state storage media 110 is biased toward a balance of binary ones and zeroes. The bias module 318 uses the whitening module 512 to bias the source data packet 622 toward the bias of the solid-state storage media 110 to form a biased data packet 624. The whitening module 512 may encrypt the source data packet 622, or use another pseudo-randomization method to bias the source data packet 622 to form the biased data packet 624. The inverse bias module 332 uses the inverse bit biasing module 552 to reverse the pseudo-randomization of the biased data packet 624 to convert the bits of the biased data packet 624 back to the bits of the source data packet 622.

Flow Charts

Figure 7:
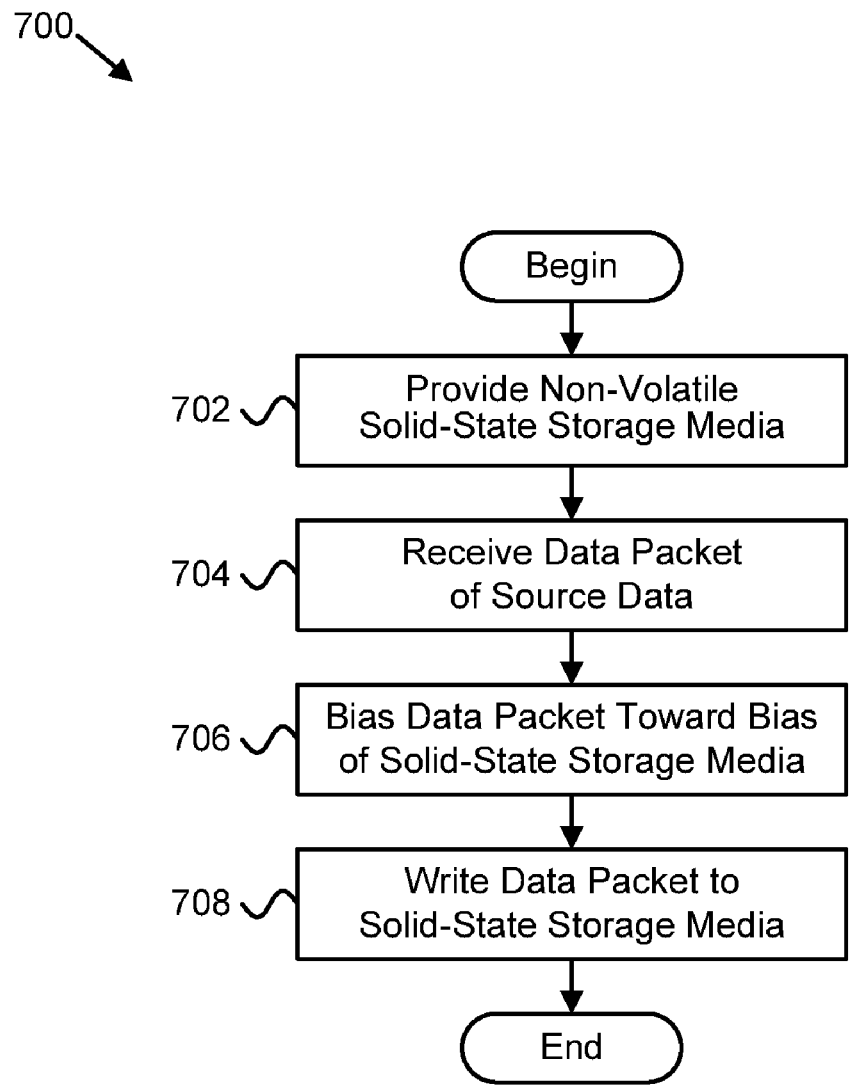
FIG. 7 is a schematic flow chart diagram illustrating one embodiment of a method for improving performance in a solid-state storage device in accordance with the present invention.

FIG. 7 is a schematic flow chart diagram illustrating one embodiment of a method 700 for improving performance in a solid-state storage device 102 in accordance with the present invention. The method 700 begins and the solid-state storage device 102 provides 702 the non-volatile solid-state storage media 110. The solid-state storage device 102 may provide 702 the solid-state storage media 110 to the computer 112, to a client 114, to a module, to another device, or the like to provide 702 data storage.

The input module 502 receives 704 a data packet of source data. In one embodiment, the data packet is sized for storage in a storage region of the solid-state storage media 110. The bit biasing module 508 biases 706 the data packet toward the bias of the solid-state storage media 110. In various embodiments, the bit biasing module 508 may use one or more of the flip module 510, the whitening module 512, the bias compression module 514, and the relocation module 516 to bias 706 the data packet.

The write module 506 writes 708 the data packet to the storage region of the solid-state storage media 110 and the method 700 ends. In one embodiment, the storage cells each store an initial binary value that satisfies a bias, such as bias toward binary ones, and the write module 506 writes 708 the data packet to the storage region by changing the bit values stored in one or more storage cells to a bit value that is different from the initial binary value, such as a binary zero, to match the bit values of the data packet.

Figure 8:
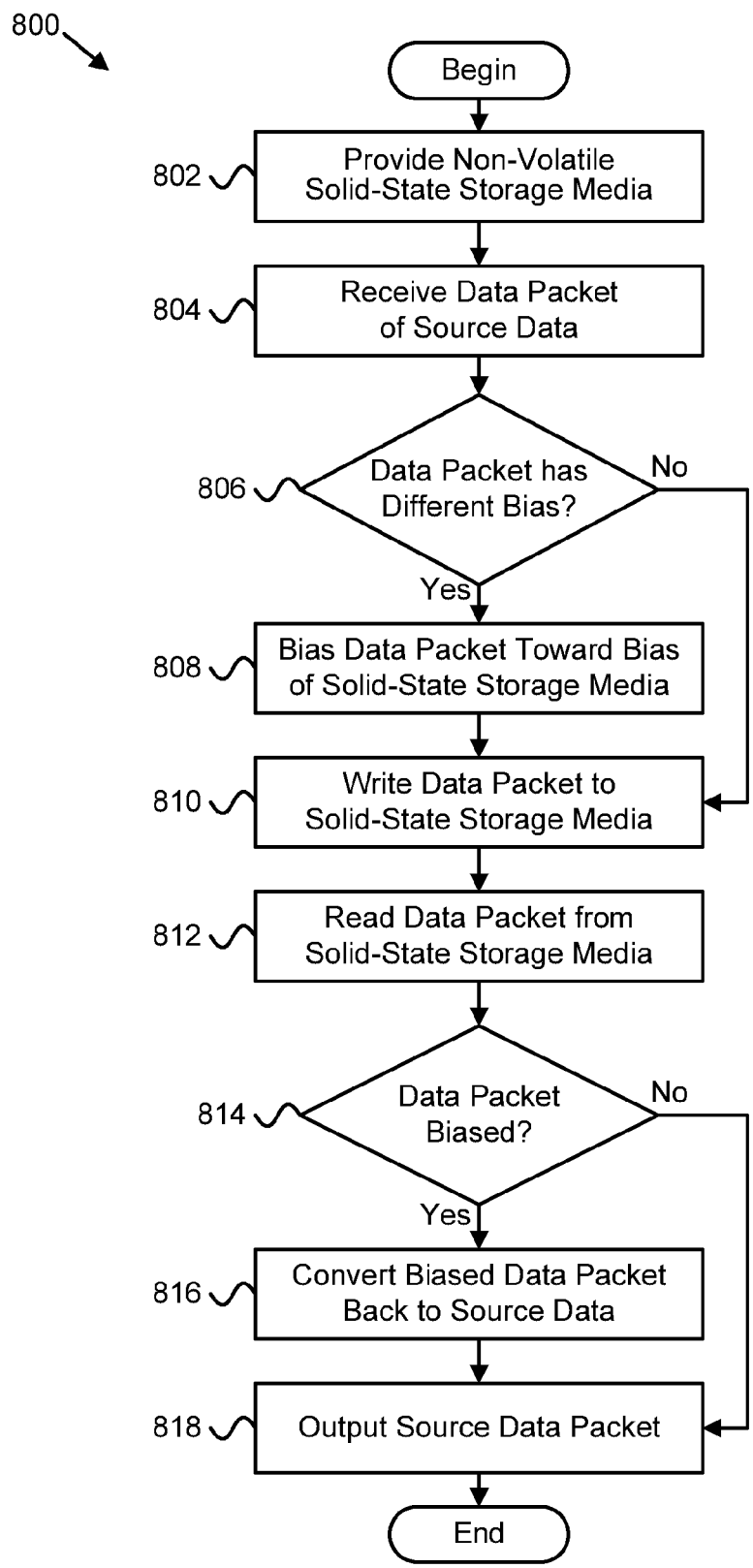
FIG. 8 is a schematic flow chart diagram illustrating another embodiment of a method for improving performance in a solid-state storage device in accordance with the present invention.

FIG. 8 is a schematic flow chart diagram illustrating another embodiment of a method 800 for improving performance in a solid-state storage device 102 in accordance with the present invention. The method 800 begins and the solid-state storage device 102 provides 802 the non-volatile media of the solid-state storage media 110. The solid-state storage device 102 may provide 802 the solid-state storage media 110 to the computer 112, to a client 114, to a module, to another device, or the like to provide 802 data storage.

The input module 502 receives 804 a data packet of source data. In one embodiment, the data packet is sized for storage in a storage region of the solid-state storage media 110. The bias determination module 504 determines 806 whether a source bias of the data packet is different than a bias of storage cells in the solid-state storage media 110. If the bias determination module 504 determines 806 that the source bias of the data packet is different than the bias of the storage cells, the bit biasing module 508 biases 808 the data packet toward the bias of the solid-state storage media 110. In various embodiments, the bit biasing module 508 may use one or more of the flip module 510, the whitening module 512, the bias compression module 514, and the relocation module 516 to bias 808 the data packet.

In one embodiment, if the bias determination module 504 determines 806 that the source bias of the data packet is not different than the bias of the storage cells, the method 800 skips the biasing step 808. In a further embodiment, if the bias determination module 504 determines that the source bias of the data packet exactly matches the bias of the storage cells, or that the data packet, upon being biased by the bit biasing module 408 would exactly match the bias of the storage cells, the method 800 skips the biasing step 808, or reversibly alters the data packet such that the data packet does not exactly match the bias of the storage cells.

If a data packet that exactly matches the bias of the storage cells is written to the storage cells, it may be difficult to determine whether data read from the cells is in error, or whether the storage cells are simply in their biased state. For example, in one embodiment, if the write module 406 writes a data packet having all binary ones to storage cells that exhibit a bias toward binary ones, the solid-state storage controller 104 may not be able to determine whether the storage cells are storing an error-free data packet with values of all ones, or whether a write operation or media failure caused the data packet to be stored with all ones, in which case the storage cells may be still storing their initial bias values of one instead of error free data.

In another embodiment, the method 800 does not include step 806, and the bit biasing module 508 biases 808 a data packet based on expected or anticipated probabilities of the data packet having a bias different than the bias of the storage cells. The indicator module 518, in one embodiment, stores an indicator to indicate whether the bit biasing module 508 has biased the data packet. In a further embodiment, the method 800 does not use an indicator.

The write module 506 writes 810 the data packet to the storage region of the solid-state storage media 110. In one embodiment, the storage cells each store an initial binary value that satisfies a bias, such as bias toward binary ones, and the write module 506 writes 810 the data packet to the storage region by changing the bit values stored in one or more storage cells to a bit value that is different from the initial binary value, such as a binary zero, to match the bit values of the data packet.

In response to a read request or the like, the read module 550 reads 812 the data packet from the solid-state storage media 110. In one embodiment, the inverse bit biasing module 552 determines 814 whether the bit biasing module 508 biased 808 the data packet. If the inverse bit biasing module 552 determines 814 that the bit biasing module 508 biased 808 the data packet, the inverse bit biasing module 552 converts 816 the bits of the biased data packet back to the source data from the data packet.

In another embodiment, the method 800 does not include step 814, and the inverse bit biasing module 552 converts 816 each biased data packet or each biased data packet of a certain type without a determination 814. In one embodiment, if the inverse bit biasing module 552 determines 814 that the bit biasing module 508 did not bias 808 the data packet, the method 800 skips the converting step 816. The output module 554 outputs 818 the source data packet and the method 800 ends.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method to improve performance in a non-volatile solid-state storage device, the method comprising:
   providing non-volatile solid-state storage media comprising a plurality of storage cells, the plurality of storage cells configured such that storage cells in an empty state store initial binary values that satisfy a bias;
   receiving source data for storage in the plurality of storage cells of the non-volatile solid-state storage media, bits of the source data having a source bias different from the bias of the plurality of storage cells;
   biasing the bits of the source data toward the bias of the plurality of storage cells; and
   writing the biased source data to the plurality of storage cells of the non-volatile solid-state storage media.

2. The method of claim 1, further comprising reading the biased source data from the plurality of storage cells of the non-volatile solid-state storage media and converting the bits of the biased source data back to original bit values for the source data such that a bias of the bits returns to the source bias.

3. The method of claim 1, further comprising determining that the source bias of the source data is different from the bias of the plurality of storage cells.

4. The method of claim 1, further comprising storing an indicator for the biased source data to indicate that the bits of the biased source data have been biased.

5. The method of claim 1, further comprising shifting the bits within the source data according to a reversible algorithm such that a start position for data and metadata within the source data changes between writing the biased source data to the plurality of storage cells and writing subsequent biased source data to the plurality of storage cells.

6. The method of claim 1, wherein the bias of the plurality of storage cells is selected from the group consisting of a bias toward ones, a bias toward zeroes, and a bias toward a balance of ones and zeroes.

7. The method of claim 1, wherein the bias of the plurality of storage cells comprises a bias toward a binary pattern.

8. The method of claim 7, wherein the binary pattern is selected based on a state of one or more other storage cells physically adjacent to the plurality of storage cells.

9. The method of claim 8, wherein the binary pattern satisfies a predefined voltage differential threshold between the one or more other storage cells and the plurality of storage cells.

10. The method of claim 1, wherein biasing the bits of the source data comprises flipping binary values of the bits to satisfy the bias of the plurality of storage cells.

11. The method of claim 1, wherein biasing the bits comprises pseudo-randomizing the values of the bits of the source data.

12. The method of claim 1, wherein biasing the bits comprises,
retrieving a preset sequence number associated with the plurality of storage cells;
entering the preset sequence number into a pseudo-random number generator as a seed value to obtain a pseudo-random binary sequence; and
biasing the bits of the source data toward the bias of the plurality of storage cells by pseudo-randomizing the values of the bits of the source data using the pseudo-random binary sequence.

13. The method of claim 12, wherein the preset sequence number comprises a sequence number of an erase block associated with the plurality of storage cells, the preset sequence number stored in a predefined location in the erase block during an erase procedure such that the preset sequence number for the erase block changes with each erase procedure.

14. The method of claim 1, wherein biasing the bits comprises padding the source data with padding data having binary values that bias the source data toward the bias of the plurality of storage cells.

15. The method of claim 14, wherein biasing the bits further comprises compressing the source data and selecting a size of the padding data based on an amount of space gained by the compression.

16. The method of claim 1, wherein biasing the bits of the source data comprises biasing a plurality of bits of the source data such that storage cells of the source data storing the plurality of bits change state from original-state storage cells to active storage cells.

17. The method of claim 1, wherein biasing the bits of the source data comprises dividing the source data into a plurality of subsets of the source data and biasing the subsets of the source data, the subsets of the source data sized to fit a write data pipeline.

18. The method of claim 1, wherein biasing the bits of the source data comprises excluding the source data from application of a bias in response to the source data prior to biasing having a bias that matches the bias of the plurality of storage cells.

19. An apparatus to improve performance in a non-volatile solid-state storage device, the apparatus comprising:
non-volatile solid-state storage media comprising a plurality of storage cells, the plurality of storage cells configured such that storage cells in an empty state store initial binary values that satisfy a bias;
an input module that receives source data for storage in the plurality of storage cells of the non-volatile solid-state storage media, bits of the source data having a source bias different from the bias of the plurality of storage cells;
a bit biasing module that biases the bits of the source data toward the bias of the plurality of storage cells; and
a write module that writes the biased source data to the plurality of storage cells of the non-volatile solid-state storage media.

20. The apparatus of claim 19, wherein the bit biasing module biases the bits by,
retrieving a preset sequence number associated with the plurality of storage cells;
entering the preset sequence number into a pseudo-random number generator as a seed value to obtain a pseudo-random binary sequence; and
biasing the bits of the source data toward the bias of the plurality of storage cells by pseudo-randomizing the values of the bits of the source data using the pseudo-random binary sequence.

21. A system to improve performance in a non-volatile solid-state storage device, the system comprising:
a processor;
one or more communications buses in communication with the processor;
non-volatile solid-state storage media comprising a plurality of storage cells, the plurality of storage cells configured such that storage cells in an empty state store initial binary values that satisfy a bias;
an input module that receives source data from the processor over the one or more communications buses for storage in the plurality of storage cells of the non-volatile solid-state storage media, bits of the source data having a source bias different from the bias of the plurality of storage cells;
a bit biasing module that biases the bits of the source data toward the bias of the plurality of storage cells; and
a write module that writes the biased source data to the plurality of storage cells of the non-volatile solid-state storage media.

22. A method to improve performance in a non-volatile solid-state storage device, the method comprising:
providing non-volatile solid-state storage media comprising a plurality of storage cells;
receiving source data for storage in the plurality of storage cells of the non-volatile solid-state storage media;
shifting bits within the source data according to a reversible algorithm such that a start position for data and metadata within the source data changes between writing the source data to the plurality of storage cells and writing subsequent source data to the plurality of storage cells; and writing the shifted source data to the plurality of storage cells of the non-volatile solid-state storage media.

23. The method of claim 22, further comprising biasing the bits of the source data toward a bias of the plurality of storage cells, wherein the plurality of storage cells are configured such that storage cells in an empty state store initial binary values that satisfy the bias of the plurality of storage cells and the bits of the source data as received have a source bias different from the bias of the plurality of storage cells.

* * * * *